United States Patent
Osano et al.

(10) Patent No.: US 8,263,961 B2
(45) Date of Patent: Sep. 11, 2012

(54) THIN FILM MEMORY DEVICE HAVING A VARIABLE RESISTANCE

(75) Inventors: Koichi Osano, Osaka (JP); Shunsaku Muraoka, Osaka (JP); Hiroshi Sakakima, Kyoto (JP)

(73) Assignee: Panasonic Corporation, Osaka (JP)

( * ) Notice: Subject to any disclaimer, the term of this patent is extended or adjusted under 35 U.S.C. 154(b) by 888 days.

(21) Appl. No.: 11/578,521

(22) PCT Filed: Oct. 22, 2004

(86) PCT No.: PCT/JP2004/016080
§ 371 (c)(1),
(2), (4) Date: Oct. 16, 2006

(87) PCT Pub. No.: WO2005/101420
PCT Pub. Date: Oct. 27, 2005

(65) Prior Publication Data
US 2007/0196696 A1 Aug. 23, 2007

(30) Foreign Application Priority Data
Apr. 16, 2004 (JP) .................................. 2004-121237

(51) Int. Cl.
*H01L 45/00* (2006.01)
(52) U.S. Cl. .......................... 257/4; 257/E45.002; 257/3
(58) Field of Classification Search ............... 257/2, 421, 257/E45.002, 4, 3
See application file for complete search history.

(56) References Cited

U.S. PATENT DOCUMENTS

| | | | |
|---|---|---|---|
| 6,204,139 B1 | 3/2001 | Liu et al. | |
| 6,587,371 B1 | 7/2003 | Hidaka | |
| 2001/0026466 A1 | 10/2001 | Adachi et al. | |
| 2002/0006058 A1 | 1/2002 | Nakajima et al. | |
| 2002/0036315 A1 | 3/2002 | Adachi et al. | |
| 2002/0109172 A1* | 8/2002 | Okazawa | 257/298 |
| 2002/0177013 A1* | 11/2002 | Hiramoto et al. | 428/702 |
| 2003/0012050 A1* | 1/2003 | Iwasaki | 365/171 |

(Continued)

FOREIGN PATENT DOCUMENTS
EP  1 033 764 A2  9/2000
(Continued)

OTHER PUBLICATIONS

Zhenyu Wu, et al., "Electrical properties and phase transition of $CoFe_2O_4$ nanocrystals under pressure," Journal of Applied Physics, Jun. 15, 2003, pp. 9983-9987, vol. 93, No. 12, American Institute Physics.

(Continued)

*Primary Examiner* — Kenneth Parker
*Assistant Examiner* — Paul Budd
(74) *Attorney, Agent, or Firm* — McDermott Will & Emery LLP

(57) ABSTRACT

A thin film storage device includes a first electrode (3), a first variable resistance thin film (2), and a second electrode (1). The first electrode (3) is formed over a surface of a substrate (4). The first variable resistance thin film (2) is formed over a surface of the first electrode (3). The second electrode (1) is formed over a surface of the first variable resistance thin film (2). The first variable resistance thin film (2) comprises a material whose resistance in a bulk state changes in accordance with at least one of a lattice strain and a change of charge-order.

5 Claims, 18 Drawing Sheets

U.S. PATENT DOCUMENTS

| | | |
|---|---|---|
| 2003/0090935 A1 | 5/2003 | Hidaka |
| 2003/0197505 A1 | 10/2003 | Sakakima et al. |
| 2004/0052131 A1 | 3/2004 | Komuro et al. |

FOREIGN PATENT DOCUMENTS

| | | |
|---|---|---|
| EP | 1 109 170 A2 | 6/2001 |
| EP | 1 191 344 A2 | 3/2002 |
| JP | 3-203084 A | 9/1991 |
| JP | 06-509909 | 11/1994 |
| JP | 2001-236781 | 8/2001 |
| JP | 2001-339110 | 12/2001 |
| JP | 2002-111094 | 4/2002 |
| JP | 2004-039672 | 2/2004 |
| WO | WO 93/04506 | 3/1993 |

OTHER PUBLICATIONS

R.K. Zheng, et al., "Ultrasonic study of the $Nd_{0.5}Sr_{0.5}MnO_3$ manganite," Journal of Alloys and Compounds, Oct. 28, 2002, pp. 68-71, vol. 345, No. 1-2, Elsevier Science B.V.

E.G. Gerstner, "Nonvolatile memory effects in nitrogen doped tetrahedral amorphous carbon thin films," Journal of Applied Physics, Nov. 15, 1998, pp. 5647-5651, vol. 84, No. 10, American Institute of Physics.

Tanaka, H., et al., "Giant Electric Field Modulation of Double Exchange Ferromagnetism at Room Temperature in the Perovskite Manganite/Titanate *p-n* Junction", Physical Review Letters, Jan. 14, 2002, vol. 88 No. 2, The American Physical Society.

Japanese Office Action, with English translation, issued in Japanese Patent Application No. 2006-536974, mailed Jun. 29, 2010.

\* cited by examiner

| | MATERIAL | THICKNESS[μm] |
|---|---|---|
| RESISTANCE CHANGING MATERIAL | CuFe2O4 | 0.2 |
| UPPER ELECTRODE | Ru | 0.4 |
| LOWER ELECTRODE | Ru | 0.4 |

| PULSE WIDTH[ns] | PULSE VOLTAGE[V] | SUBSTRATE TEMPERATURE[°C] |
|---|---|---|
| 100 | ±5 | 350 |

|  | MATERIAL | THICKNESS[μm] |
|---|---|---|
| RESISTANCE CHANGING MATERIAL | NiCr2O4 | 0.2 |
| UPPER ELECTRODE | IrO2 | 0.4 |
| LOWER ELECTRODE | IrO2 | 0.4 |

| PULSE WIDTH[ns] | PULSE VOLTAGE[V] | SUBSTRATE TEMPERATURE[°C] |
|---|---|---|
| 100 | ±4 | 400 |

| | MATERIAL | THICKNESS[μm] |
|---|---|---|
| RESISTANCE CHANGING MATERIAL | Fe3O4 | 0.2 |
| UPPER ELECTRODE | Ru | 0.4 |
| LOWER ELECTRODE | Ru | 0.4 |

| PULSE WIDTH[ns] | PULSE VOLTAGE[V] | SUBSTRATE TEMPERATURE[°C] |
|---|---|---|
| 100 | ±4 | 300 |

| | MATERIAL | THICKNESS[μm] |
|---|---|---|
| RESISTANCE CHANGING MATERIAL | Tl2Mn2O7 | 0.1 |
| UPPER ELECTRODE | Pt | 0.4 |
| LOWER ELECTRODE | Pt | 0.4 |

| PULSE WIDTH[ns] | PULSE VOLTAGE[V] | SUBSTRATE TEMPERATURE[°C] |
|---|---|---|
| 100 | ±5 | 600 |

(a) IN RECORDING MODE (b) RESISTANCE CHANGE OF STORAGE ELEMENT (a) IN REPRODUCING MODE (b) OUTPUT CURRENT (a) IN RECORDING MODE

⟨RESISTANCE CHANGE OF STORAGE ELEMENT 101a⟩    ⟨RESISTANCE CHANGE OF STORAGE ELEMENT 101b⟩

(b) RESISTANCE CHANGES OF STORAGE ELEMENTS (a) IN REPRODUCING MODE (b) OUTPUT VOLTAGE

THIN FILM MEMORY DEVICE HAVING A VARIABLE RESISTANCE

TECHNICAL FIELD

The present invention relates to a storage device, a memory circuit, and a semiconductor integrated circuit each having a variable resistance thin film.

BACKGROUND

Following advancement of digital technology for electronic equipment, there is great demand for a solid-state storage device of increased capacity and for accelerating data transfer so as to lessen the amount of time to store data. U.S. Pat. No. 6,204,139 discloses one such technique for meeting these demands. The technique includes forming a solid-state storage device using a perovskite material (e.g., Pr1-xCaxMnO3(PCMO), LaSrMnO3(LSMO), or GdBaCoxOy (GBCO)), which has a resistance which changes in accordance with an applied electric pulse. As such, perovskite material may be used to store different numeric values.

In addition, J. Appl. Phys., Vol. 84, (1998), p5647, proposes a memory element using a deep acceptor level and a shallow donor level of an amorphous carbon film in which the film's resistance changes according to injected charges.

Although these materials are said to have variable resistances, it is not disclosed specifically the structure and characteristics of these materials and other materials that may be best suited for a memory. As well, characteristics of these materials are destroyed in semiconductor processing.

SUMMARY

According to one aspect of this invention, a thin film storage device includes a first electrode, a first variable resistance thin film, and a second electrode. The first electrode is formed over a surface of a substrate. The first variable resistance thin film is formed over a surface of the first electrode. The second electrode is formed over a surface of the first variable resistance thin film. The first variable resistance thin film comprises a material (variable resistance material) whose resistance in a bulk state changes in accordance with at least one of a lattice strain and a change of charge-order.

It is discovered that, if the material whose resistance in a bulk state changes in accordance with at least one of a lattice strain and a change of charge-order is formed into a thin film, and the voltage is applied to the thin film, the resistance of the thin film changes. The storage device can store one-bit or multiple-bit information by changing the state of the resistance of the thin film according to the applied voltage.

It is preferable that the lattice strain is generated by a Jahn-Teller effect.

It is also preferable that wherein the material does not contain an alkali metal or an alkaline-earth metal.

In the storage device, the variable resistance thin film does not contain both or one of the alkali metal and the alkaline-earth metal, it is possible to prevent the deterioration in the characteristics of the storage device caused by elusion of such an element at the cleaning step in the semiconductor process.

It is preferable that the material comprises a spinel structure.

It is also preferable that a thickness of the first variable resistance thin film is equal to or less than 200 nm.

The thickness of the variable resistance thin film used in the storage device is preferably equal to or less than 200 nm in light of a reduction in the electric pulse and the manufacturing process.

It is preferable that the first variable resistance thin film is constituted by a single phase.

It is also preferable that the first variable resistance thin film comprises a plurality of resistance phases.

It is preferable that at least one of the first electrode and the second electrode comprises Ag, Au, Pt, Ru, RuO2, Ir, or IrO2.

In the storage device, the material relatively low in work function is used for the electrodes. Therefore, the storage device can operate at lower voltage than the conventional storage device.

It is preferable that the thin film storage device further includes a second variable resistance thin film in a memory cell. The memory cell includes the first variable resistance thin film. The second variable resistance thin film is made from a material whose resistance in a bulk state changes in accordance with at least one of a lattice strain, a change of charge-order, a temperature change, and a change in magnetic field.

It is preferable that the first variable resistance thin film and the second variable resistance thin film store at least one bit of information in accordance with a predetermined voltage by oppositely changing the resistance of the first variable resistance thin film and the resistance of the second variable resistance thin film.

The storage device is constituted so that the resistances of the two variable resistance thin films change complementarily with each other. Therefore, it is possible to ensure stable operations as the memory cell and greatly improve manufacturing yield.

According to another aspect of this invention, a thin film storage device includes: a first electrode, a first variable resistance thin film, and a second electrode. The first electrode is formed over a surface of a substrate. The first variable resistance thin film has a spinel structure formed over a surface of the first electrode. The second electrode is formed over a surface of the first variable resistance thin film.

In order to form a material having a perovskite structure into a film, it is normally necessary to set the substrate temperature at 700° C. or higher. In order to form a material having the spinel structure into a film, it suffices that the substrate temperature is set at about 400° C. Further, in the CMOS process, the film formation temperature is preferably equal to or lower than 450° C. so as to prevent destruction or the like caused by high temperature. In the storage device the material has the spinel structure. Therefore, this material can be formed into a film at a lower temperature than the material having the perovskite structure. Accordingly, a good matching of the material having the spinel structure with the semiconductor process is ensured.

It is preferable that the first variable resistance thin film comprises a material which has the spinel structure and whose resistance in a bulk state changes in accordance with at least one of a lattice strain, a change of charge-order, a change of temperature, and a change of magnetic field.

It is discovered that, if the material whose resistance in a bulk state changes in according to at least one of the lattice strain, the charge-order, the temperature change, and the magnetic transfer is formed into a thin film, and the voltage is applied to the thin film, the resistance of the thin film changes. The storage device can store one-bit or multiple-bit information by changing the state of the resistance of the thin film according to the applied voltage.

It is preferable that the thin film storage device further includes a second variable resistance thin film in a memory cell. The memory cell includes the first variable resistance thin film. The second variable resistance thin film comprises a material whose resistance in a bulk state changes in accordance with at least one of a lattice strain, a change of charge-order, a temperature change, and a change in magnetic field.

It is preferable that the first variable resistance thin film and the second variable resistance thin film are configured to store at least one bit of information in accordance with a predetermined voltage by oppositely changing the resistance of the first variable resistance thin film and the resistance of the second variable resistance thin film. The storage device is constituted so that the resistances of the two variable resistance thin films change complementarily with each other. Therefore, it is possible to ensure stable operations as the memory cell and greatly improve manufacturing yield.

DETAILED DESCRIPTION

Figure 1:
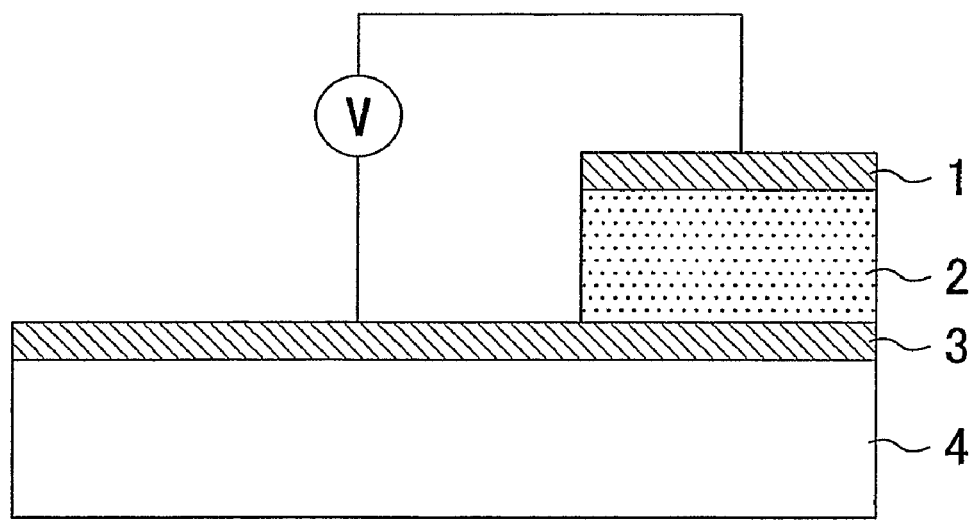
FIG. 1 depicts an exemplary configuration of a storage device according to a first embodiment of this invention.

Embodiments of this invention will be described hereinafter in detail with reference to the drawings. In the drawings, same or corresponding constituent elements are denoted by the same reference symbols, respectively, and will not be described repeatedly.

First Embodiment

Configuration

FIG. 1 depicts configuration of a storage device according to a first embodiment of this invention. Storage device comprises a lower electrode 3 formed over a surface of a substrate 4, a variable resistance thin film 2 formed over a surface of lower electrode 3, and an upper electrode 1 formed over variable resistance thin film 2. Storage device is capable of storing information according to a resistance state of the variable resistance thin film 2.

Resistance of the variable resistance thin film 2 may be changed according to an electric pulse applied thereto via upper electrode 1 and/or lower electrode 3. Upper electrode 1 and lower electrode 3 may be formed from a material having a low work function, such as Pt, Ru, Ir, Ag, Au, RuO2, or IrO2. It may be necessary to use a material for lower electrode 3 that is stable at heating temperature since the variable resistance thin film 2 is normally formed by heating the substrate 4.

As alluded to above, storage device may be used as non-volatile memory. In order to be operable as non-volatile memory, variable resistance thin film 2 needs to retain its properties even when changed. The inventors found that this can be accomplished by forming variable resistance thin film 2 made of material that satisfies at least one of the following conditions in a bulk state:

1. The material changes resistance according to a temperature change;
2. The material changes resistance according to an applied magnetic field;
3. The material changes resistance according to a lattice strain; and
4. The material changes according to a charge-order.

For the material to satisfy any of the above conditions, the inventors have found that the material should have at least one of the following characteristics:

5. A material that does not contain an alkali metal and an alkaline-earth metal;
6. A material that has a spinel structure; and
7. A material a film thickness of which is equal to or less than 200 nm.

The material may not be limited to the conditions and characteristics described above. However, the reason for using a material that satisfies at least one of the conditions described above to form the variable resistance thin film 2 will be described next.

Generally, it is difficult to change the resistance material having at least one of the conditions described above even if an electric pulse of several volts is applied to the material. However, if the material is formed into a thin film, the resistance of the material (i.e., the thin film) may be changed if an electric pulse of about several volts is applied to the thin film. For example, the resistance of such a material whose resistance may change according to a Jahn-Teller effect, which is a type of lattice strain, should be formed into a thin film and an electric pulse of several volts (e.g., about ±5V) is applied to the thin film.

Conversely, it is difficult to change the resistance of the material which does not transfer in a bulk state according to any of the temperature change, the magnetic transfer, the lattice transfer, and the charge-order, to a phase whose resistance is different even if the material is formed into a thin film and an electric pulse of several volts is applied to the material.

Consider, for example, a variable resistance material A constituted so that it transfers to a phase whose resistance is different at a predetermined transfer temperature in a bulk state, and a material B constituted so that it does not transfer, both of which materials are equal in crystal structure. If the variable resistance material A is formed into a thin film and an electric pulse is applied to the thin film, the resistance can be changed. On the other hand, even if the material B is formed into a thin film and an electric pulse is applied to the thin film, it is difficult to change the resistance.

It is also preferable that the variable resistance thin film 2 used in this embodiment has a thickness of 1 μm or less so as to form a storage device by a semiconductor process. If the material in a bulk state is formed into a thin film having a thickness of 1 μm or less, the resistance of the thin film can be changed sufficiently by an electric pulse.

As can be seen, the resistance of the material which changes resistance in a bulk state according to at least one of the lattice strain, the charge-order, the temperature change, and the magnetic transfer, to a phase whose resistance is different can be increased or decreased by the electric pulse if the material is formed into a thin film.

The reasons for the material having the characteristic(s) described above will be discussed below.

Generally, high-temperature superconductive material or CMR material is an oxide containing at least one of an alkali metal and an alkaline-earth metal. If the storage device is formed using such a material, characteristics of the storage device are deteriorated since either the alkali metal or the alkaline-earth metal contained in the material is eluted at a cleaning step in the semiconductor process. To prevent the deterioration of characteristics, it is preferable that the material does not contain the alkali metal and the alkaline-earth metal.

In order to form a material having a perovskite structure into a thin film, it is necessary to set a substrate temperature at 700° C. or higher. However, since the temperature is desirably set at 450° C. or less during film formation so as to prevent destruction or the like caused by high temperature in a CMOS process, it is not possible to form the material having the conventional perovskite structure into a thin film. On the other hand, it suffices that the substrate temperature is set at about 400° C. so as to form a film using the material having a spinel structure. Therefore, by using the material having the spinel structure, the temperature can be set lower during the film formation. Thus, the matching of the material having the spinel structure with the semiconductor process is better than that of the material having the perovskite structure with the semiconductor process.

As the variable resistance thin film 2 is thicker, a pulse voltage of the electric pulse necessary to increase or reduce the resistance of the variable resistance material for the film 2 should be higher. In addition, at a lithography step in a manufacturing process, the variable resistance thin film 2 is processed more easily if the film 2 is thinner. It is, therefore, preferable that the thickness of the variable resistance thin film 2 used for the storage device is equal to or less than 200 nm in light of a reduction in the electric pulse and the manufacturing process.

<Phase Present in Material>

The variable resistance thin film 2 that satisfies at least one of the conditions 1 to 4 exhibits a state in which the entire thin film is constituted by a single phase and a state in which a plurality of different phases are present. In either state, a stable phase is present, so that the state can be stably kept for a long time.

If the entire material is constituted by a single phase, then the entire variable resistance thin film 2 has substantially an equal resistance, and the resistance of the entire thin film is changed when being applied with an electric pulse.

If a plurality of different phases are present, then phases whose resistance are different are locally present in the variable resistance thin film 2, and the resistance of this film 2 is changed not entirely but locally when being applied with an electric pulse.

It is noted that it is easy to form the variable resistance thin film in which a plurality of phases whose resistance are different are present if the variable resistance material transfers in a bulk state to a phase whose resistance is different is used, and formed into a thin film. Alternatively, the variable resistance thin film 2 in which a plurality of phases whose resistance are different are present can be formed by preparing a plurality of variable resistance materials (bulk materials) transfer in a bulk state to a phase whose resistance is different, and forming the bulk materials simultaneously into thin films by sputtering, evaporation, or the like.

<Examples of Variable Resistance Material>

Examples of the variable resistance material that satisfies the above-stated conditions will be shown below. It is noted that each of the variable resistance materials does not contain either the alkaline-earth metal or the alkali metal.

<Temperature Change>

Examples of the variable resistance material that exhibits a plurality of resistance states according to the temperature change in a bulk state are:

Sm2-xBixRu2O7, Eu2-xBixRu2O7, Fe3O4, and T12Mn2O7.

<Magnetic Transfer>

Examples of the variable resistance material that exhibits a plurality of resistance states according to the magnetic transfer in a bulk state are:

Sm2-xBixRu2O7, Eu2-xBixRu2O7, ZnFe2O4, (Co1-xZnx)Fe2O4, (Ni1-xZnx)Fe2O4, and T12Mn2O7.

<Lattice Strain>

Examples of the variable resistance material the crystal structure of which is strained by the Jahn-Teller effect and which exhibits a plurality of resistance states in a bulk state are:

CoFe2O4, CoxMn3-xO4, NiCr2O4, CuFe2O4, CuCr2O4, Cu0.15Ni0.85Cr2O4, Mn3O4, ZnMn2O4, ZnV2O4, Fe3O4, PrNiO3, NdNiO3, SmNiO3, EuNiO3, and LaMnO3.

<Charge-Order>

Examples of the variable resistance material that exhibits a plurality of resistance states according to the charge-order in a bulk state are:

Fe3O4, AlV2O4, ZnCr2O4, and ZnGa2O4.

<Spinel Structure>

Among the above-mentioned variable resistance materials, the following materials have the spinel structure:

CoFe2O4, CoxMn3-xO4, (Co1-xZnx)Fe2O4, (Ni1-xZnx)Fe2O4, NiCr2O4, CuFe2O4, CuCr2O4, Cu0.15Ni0.85Cr2O4, Mn3O4, ZnMn2O4, ZnV2O4, Fe3O4, AlV2O4, ZnCr2O4, ZnFe2O4, and ZnGa2O4.

The above-mentioned variable resistance materials can be easily formed into thin films. In addition, if the thickness of the variable resistance thin film 2 is equal to or less than 200 nm (or 100 nm according to a type of the film), the storage device shown in FIG. 1 is operable as a storage device.

Further, if the material having a relatively low work function is used for the upper electrode 1 and the lower electrode 3 of the storage device in which the variable resistance thin film 2 has a thickness of 200 nm or less (or 100 nm or less according to the type of the film), the storage device is operable at a lower voltage than the conventional storage device. For example, if NiCr2O4 having a thickness of 0.1 µm is used as the variable resistance material 2 in the storage device, and Pt is used for the upper electrode 1 and the lower electrode 3, then it is necessary to apply an electric pulse at a voltage of ±3V to the variable resistance thin film 2 so as to change the resistance of the film 2. If Au is used for the upper electrode 1 and the lower electrode 3 in place of Pt, the resistance of the variable resistance thin film 2 is changed when being applied with an electric pulse at a voltage of ±2.5V. Further, if Ir is used for the lower electrode 3 and Ag is used for the upper electrode 1, the resistance of the variable resistance thin film 2 is changed when being applied with an electric pulse at a voltage of ±2V. As is clear from the above, the voltage of the applied electric pulse can be reduced by using the material having a relatively low work function as the material for the electrodes.

EXAMPLES

Examples in which the variable resistance material having the spinel structure such that the crystal structure is strained by the Jahn-Teller effect is formed into a thin film, and in which the thin film is used as the variable resistance thin film 2 will next be described.

<CoFe2O4>

An example of using CoFe2O4 as the variable resistance material 2 shown in FIG. 1 will be described. CoFe2O4 used herein has a Jahn-Teller temperature of about 90K in a bulk state and its crystal structure changes at this temperature.

First, Pt is formed into a film having a thickness of 0.4 µm and the Pt film is formed on the substrate 4 as the lower electrode 3, CoFe2O4 is formed into a film having a thickness of about 0.1 µm and the CoFe2O4 film is formed as the variable resistance thin film 2 by sputtering, and Pt is formed into a film having a thickness of 0.4 µm and the Pt film is formed as the upper electrode 1. The substrate temperature when forming the CoFe2O4 film is set at 300° C.

Two types of electric pulses (a positive polarity pulse and a negative polarity pulse) are alternately applied between the upper electrode 1 and the lower electrode 3, and the resistance of the variable resistance thin film 2 is measured when an electric pulse is applied once. The positive polarity pulse is an electric pulse by which the upper electrode 1 has an electrically positive polarity relative to the lower electrode 3, and the pulse has a pulse width of 100 ns and a voltage of +3V. The negative polarity pulse is an electric pulse by which the upper electrode 1 has an electrically negative polarity relative to the lower electrode 3, and the pulse has a pulse width of 100 ns and a voltage of −3V.

Figure 2:
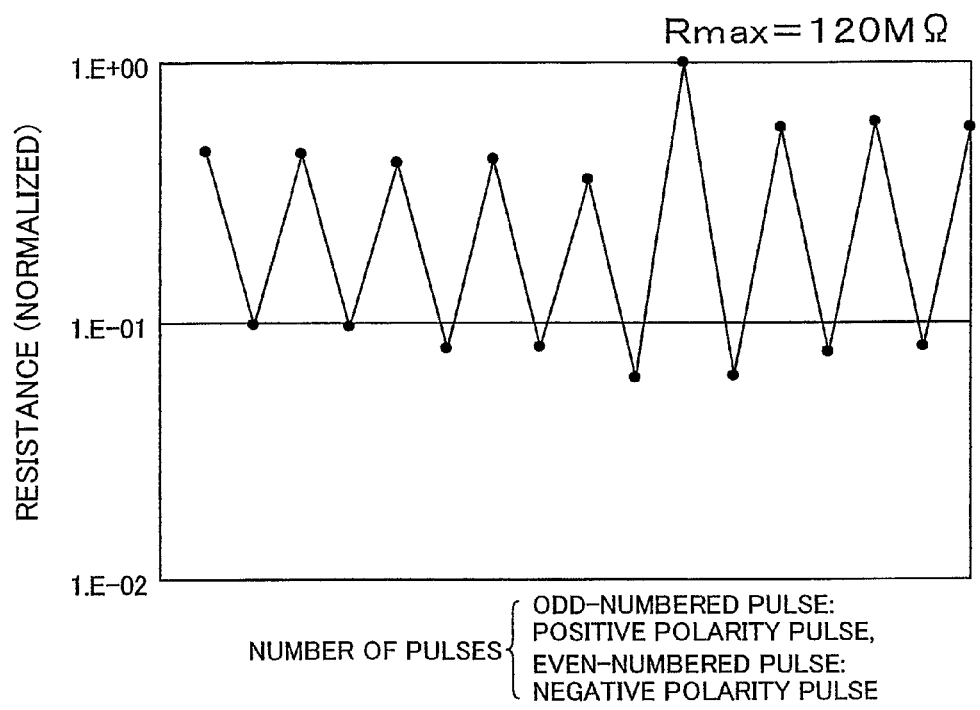
FIG. 2 depicts characteristics of CoFe2O4 formed into a thin film having a thickness of 0.1 μm.

FIG. 2 depicts a resistance change of the variable resistance thin film 2 when the positive polarity pulse and the negative polarity pulse are alternately applied to the thin film 2 as described above. The resistance of the variable resistance thin film 2 is reduced when the positive polarity pulse is applied to the thin film 2, and increased when the negative polarity pulse is applied to the thin film 2. The resistance of the variable resistance thin film 2 normally fluctuates at the start of measurement. Therefore, FIG. 2 depicts data in a state in which the resistance of the variable resistance thin film 2 is substantially constant after repeatedly applying the electric pulse to the thin film 2. In addition, each resistance of the variable resistance thin film 2 shown in FIG. 2 is a normalized value by using a highest resistance Rmax among the resistances shown in FIG. 2. The highest resistance Rmax in this sample is 120 MΩ

<CuFe2O4>

An example of using CuFe2O4 as the variable resistance thin film 2 shown in FIG. 1 will be described. CuFe2O4 used herein has a Jahn-Teller temperature of about 630K in a bulk state and its crystal structure changes at this temperature.

First, Ru is formed into a film having a thickness of 0.4 µm and the Ru film is formed on the substrate 4 as the lower electrode 3, CuFe2O4 is formed into a film having a thickness of about 0.2 µm and the CuFe2O4 film is formed as the variable resistance thin film 2, and Ru is formed into a film having a thickness of 0.4 µm and the Ru film is formed as the upper electrode 1. The substrate temperature when forming the CuFe2O4 film is set at 350° C.

Two types of electric pulses (a positive polarity pulse and a negative polarity pulse) are alternately applied between the upper electrode 1 and the lower electrode 3, and the resistance of the variable resistance thin film 2 is measured when an electric pulse is applied once. The positive polarity pulse is an electric pulse by which the upper electrode 1 has an electrically positive polarity relative to the lower electrode 3, and the pulse has a pulse width of 100 ns and a voltage of +5V. The negative polarity pulse is an electric pulse by which the upper electrode 1 has an electrically negative polarity relative to the lower electrode 3, and the pulse has a pulse width of 100 ns and a voltage of −5V.

Figure 3:
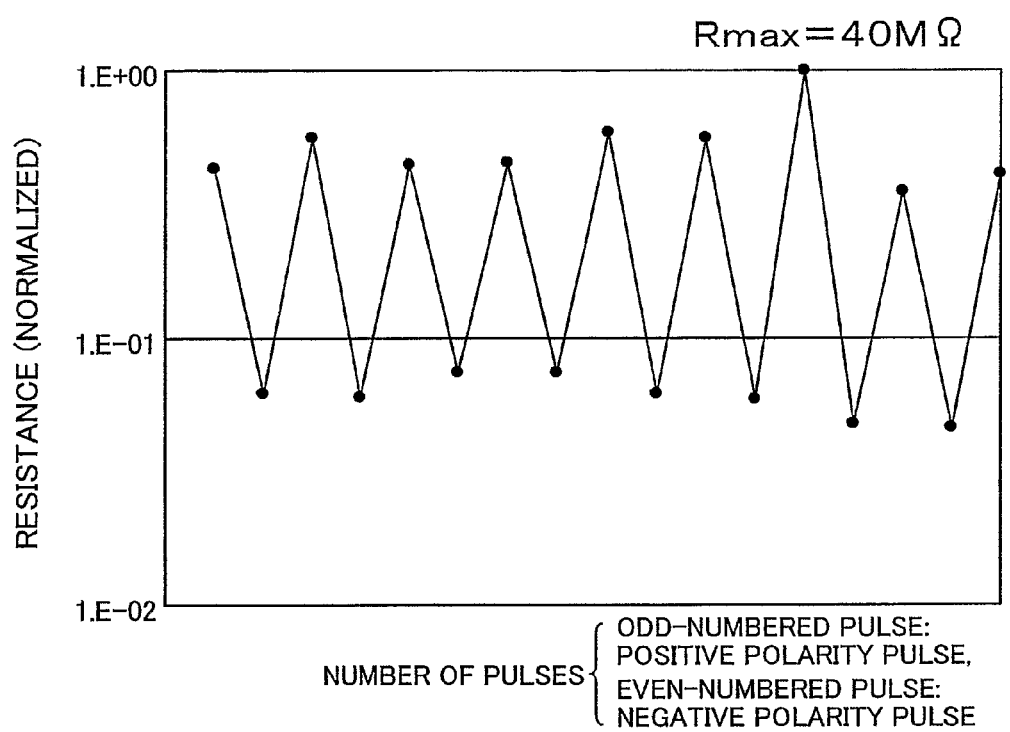
FIG. 3 depicts characteristics of CuFe2O4 formed into a thin film having a thickness of 0.2 μm.

FIG. 3 depicts a resistance change of the variable resistance thin film 2 when the positive polarity pulse and the negative polarity pulse are alternately applied to the thin film 2 as described above. The resistance of the variable resistance thin film 2 is reduced when the positive polarity pulse is applied to the thin film 2, and increased when the negative polarity pulse is applied to the thin film 2. The resistance of the variable resistance thin film 2 normally fluctuates at the start of measurement. Therefore, FIG. 3 depicts data in a state in which the resistance of the variable resistance thin film 2 is substantially constant after repeatedly applying the electric pulse to the thin film 2. In addition, each resistance of the variable resistance thin film 2 shown in FIG. 3 is a normalized value by using a highest resistance Rmax among the resistances shown in FIG. 3. The highest resistance Rmax in this sample is 40 MΩ.

<NiCr2O4>

An example of using NiCr2O4 as the variable resistance thin film 2 shown in FIG. 1 will be described. NiCr2O4 used herein has a Jahn-Teller temperature of about 300K in a bulk state and its crystal structure changes at this temperature.

First, IrO2 is formed into a film having a thickness of 0.4 µm and the IrO2 film is formed on the substrate 4 as the lower electrode 3, NiCr2O4 is formed into a film having a thickness of about 0.2 µm and the NiCr2O4 film is formed as the variable resistance thin film 2, and IrO2 is formed into a film having a thickness of 0.4 µm and the IrO2 film is formed as the upper electrode 1. The substrate temperature when forming the NiCr2O4 film is set at 400° C.

Two types of electric pulses (a positive polarity pulse and a negative polarity pulse) are alternately applied between the upper electrode 1 and the lower electrode 3, and the resistance of the variable resistance thin film 2 is measured when an electric pulse is applied once. The positive polarity pulse is an electric pulse by which the upper electrode 1 has an electrically positive polarity relative to the lower electrode 3, and the pulse has a pulse width of 100 ns and a voltage of +4V. The negative polarity pulse is an electric pulse by which the upper electrode 1 has an electrically negative polarity relative to the lower electrode 3, and the pulse has a pulse width of 100 ns and a voltage of −4V.

Figure 4:
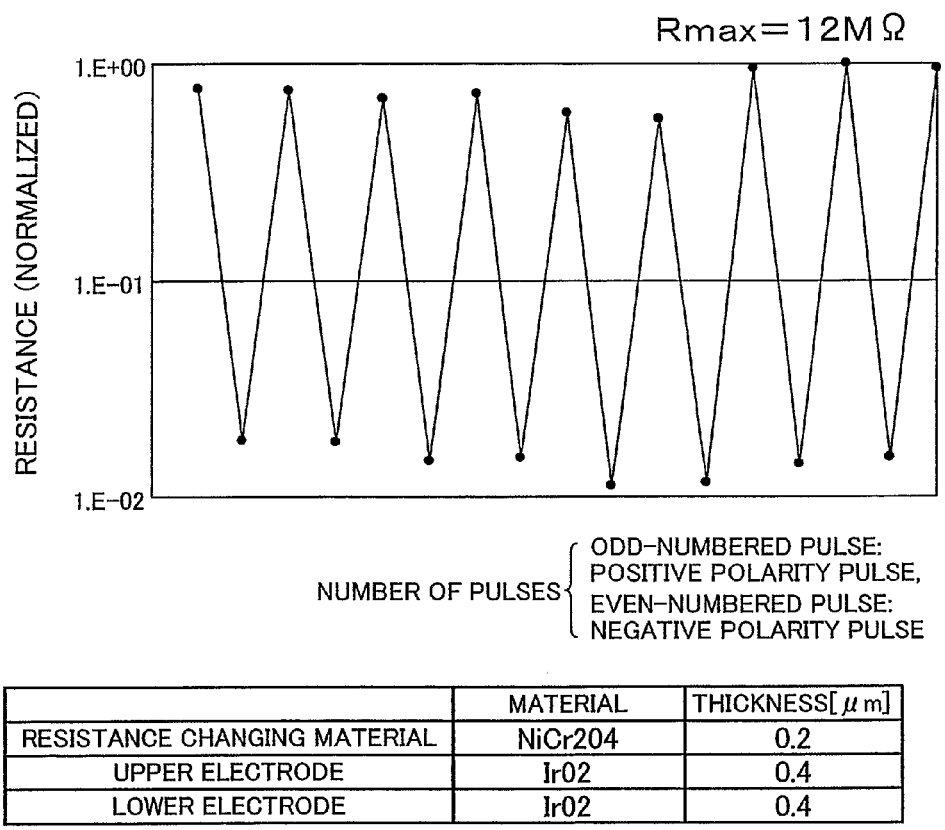
FIG. 4 depicts characteristics of NiCr2O4 formed into a thin film.

FIG. 4 depicts a resistance change of the variable resistance thin film 2 when the positive polarity pulse and the negative polarity pulse are alternately applied to the thin film 2 as described above. The resistance of the variable resistance thin film 2 is reduced when the positive polarity pulse is applied to the thin film 2, and increased when the negative polarity pulse is applied to the thin film 2. The resistance of the variable resistance thin film 2 normally fluctuates at the start of measurement. Therefore, FIG. 4 depicts data in a state in which the resistance of the variable resistance thin film 2 is substantially constant after repeatedly applying the electric pulse to the thin film 2. In addition, each resistance of the variable resistance thin film 2 shown in FIG. 4 is a normalized value by using a highest resistance Rmax among the resistances shown in FIG. 4. The highest resistance Rmax in this sample is 12 MΩ.

As shown in FIGS. 2, 3, and 4, it is discovered that, if en electric pulse is applied to the thin film formed out of the material having the spinel structure in which its crystal structure is strained by the Jahn-Teller effect, the resistance of the thin film changes. According to the above-stated experiments, if the transfer temperature (Jahn-Teller temperature) at which each of these materials exhibits the Jahn-Teller effect is closer to the room temperature, the thin film has a greater resistance change at the room temperature.

Next, examples in which the variable resistance material having the spinel structure in which a charge distribution changes according to the charge-order is formed into a thin film, and in which the thin film is used as the variable resistance thin film 2 shown in FIG. 1 will be described.

<AlV2O4>

An example of using AlV2O4 as the variable resistance thin film 2 shown in FIG. 1 will be described. AlV2O4 used herein has a charge ordering temperature of about 700K in a bulk state and its charge distribution in crystal changes at this temperature.

First, Pt is formed into a film having a thickness of 0.4 μm and the Pt film is formed on the substrate 4 as the lower electrode 3, AlV2O4 is formed into a film having a thickness of about 0.2 μm and the AlV2O4 film is formed as the variable resistance thin film 2, and Pt is formed into a film having a thickness of 0.4 μm and the Pt film is formed as the upper electrode 1. The substrate temperature when forming the AlV2O4 film is set at 400° C.

Two types of electric pulses (a positive polarity pulse and a negative polarity pulse) are alternately applied between the upper electrode 1 and the lower electrode 3, and the resistance of the variable resistance thin film 2 is measured when an electric pulse is applied once. The positive polarity pulse is an electric pulse by which the upper electrode 1 has an electrically positive polarity relative to the lower electrode 3, and the pulse has a pulse width of 100 ns and a voltage of +5V. The negative polarity pulse is an electric pulse by which the upper electrode 1 has an electrically negative polarity relative to the lower electrode 3, and the pulse has a pulse width of 100 ns and a voltage of −5V.

Figure 5:
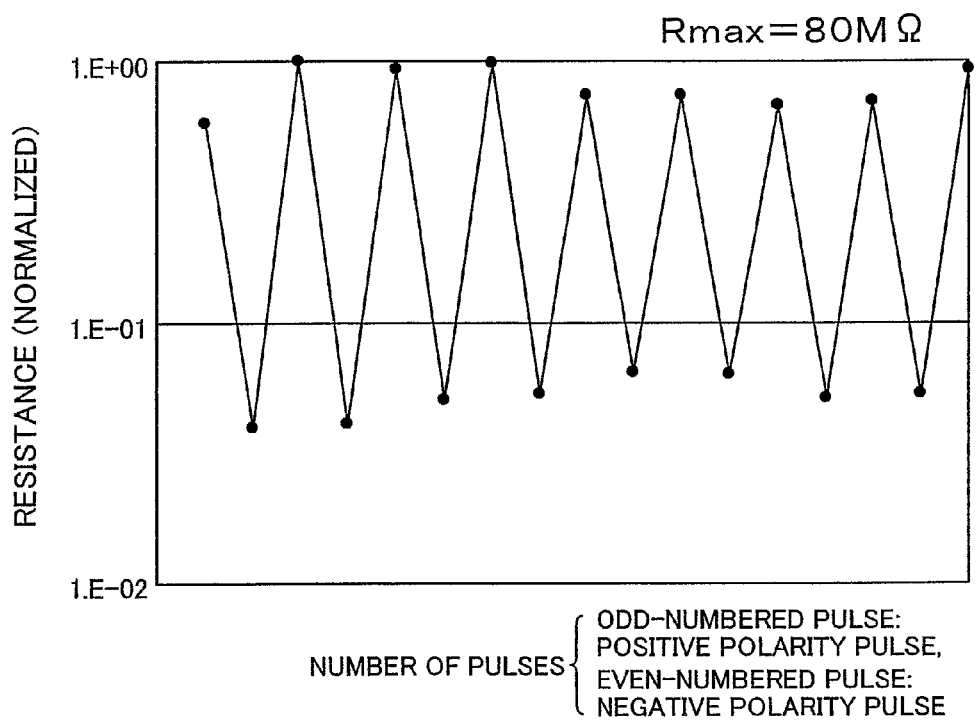
FIG. 5 depicts characteristics of AlV2O4 formed into a thin film.

FIG. 5 depicts a resistance change of the variable resistance thin film 2 when the positive polarity pulse and the negative polarity pulse are alternately applied to the thin film 2 as described above. The resistance of the variable resistance thin film 2 is reduced when the positive polarity pulse is applied to the thin film 2, and increased when the negative polarity pulse is applied to the thin film 2. The resistance of the variable resistance thin film 2 normally fluctuates at the start of measurement. Therefore, FIG. 5 depicts data in a state in which the resistance of the variable resistance thin film 2 is substantially constant after repeatedly applying the electric pulse to the thin film 2. In addition, each resistance of the variable resistance thin film 2 shown in FIG. 5 is a normalized value by using a highest resistance Rmax among the resistances shown in FIG. 5. The highest resistance Rmax in this sample is 80 MΩ.

<Fe3O4>

An example of using Fe3O4 as the variable resistance material 2 shown in FIG. 1 will be described. Fe3O4 used herein has a charge ordering temperature of about 120K in a bulk state and its charge distribution in crystal changes at this temperature.

First, Ru is formed into a film having a thickness of 0.4 μm and the Ru film is formed on the substrate 4 as the lower electrode 3, Fe3O4 is formed into a film having a thickness of about 0.2 μm and the Fe3O4 film is formed as the variable resistance thin film 2, and Ru is formed into a film having a thickness of 0.4 μm and the Ru film is formed as the upper electrode 1. The substrate temperature when forming the Fe3O4 film is set at 300° C.

Two types of electric pulses (a positive polarity pulse and a negative polarity pulse) are alternately applied between the upper electrode 1 and the lower electrode 3, and the resistance of the variable resistance thin film 2 is measured when an electric pulse is applied once. The positive polarity pulse is an electric pulse by which the upper electrode 1 has an electrically positive polarity relative to the lower electrode 3, and the pulse has a pulse width of 100 ns and a voltage of +4V. The negative polarity pulse is an electric pulse by which the upper electrode 1 has an electrically negative polarity relative to the lower electrode 3, and the pulse has a pulse width of 100 ns and a voltage of −4V.

Figure 6:
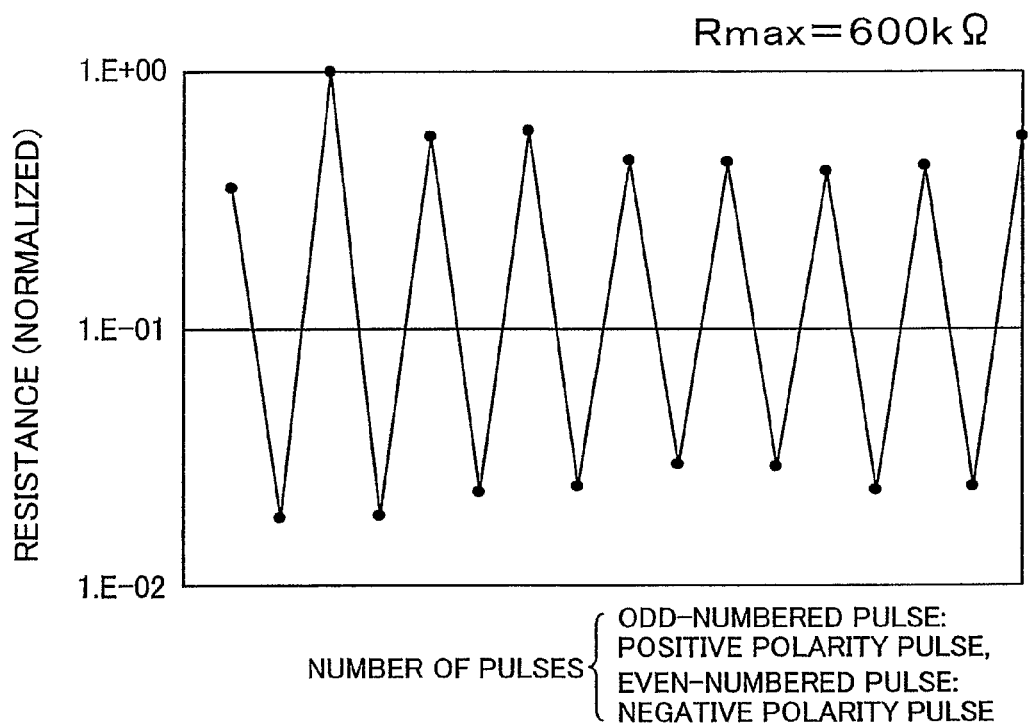
FIG. 6 depicts characteristics of Fe3O4 formed into a thin film.

FIG. 6 depicts a resistance change of the variable resistance thin film 2 when the positive polarity pulse and the negative polarity pulse are alternately applied to the thin film 2 as described above. The resistance of the variable resistance thin film 2 is reduced when the positive polarity pulse is applied to the thin film 2, and increased when the negative polarity pulse is applied to the thin film 2. The resistance of the variable resistance thin film 2 normally fluctuates at the start of measurement. Therefore, FIG. 6 depicts data in a state in which the resistance of the variable resistance thin film 2 is substantially constant after repeatedly applying the electric pulse to the thin film 2. In addition, each resistance of the variable resistance thin film 2 shown in FIG. 6 is a normalized value by using a highest resistance Rmax among the resistances shown in FIG. 6. The highest resistance Rmax in this sample is 600 MΩ.

As shown in FIGS. 5 and 6, it is discovered that, if the variable resistance material having the spinel structure in which the charge distribution changes according to the charge ordering is formed into a thin film, and an electric pulse is applied to the thin film, the resistance of the thin film changes.

Next, examples of using the variable resistance material that exhibits a plurality of resistance changes according to the magnetic transfer as the variable resistance thin film 2 shown in FIG. 1 will be described.

<Sm1.5Bi0.5Ru2O7>

An example of using Sm1.5Bi0.5Ru2O7 as the variable resistance thin film 2 shown in FIG. 1 will be described. Sm1.5Bi0.5Ru2O7 used herein has a magnetic transfer temperature of about 70K in a bulk state and its magnetic phase changes at this temperature.

First, Pt is formed into a film having a thickness of 0.4 μm and the Pt film is formed on the substrate 4 as the lower electrode 3, Sm1.5Bi0.5Ru2O7 is formed into a film having a thickness of about 0.2 μm and the Sm1.5Bi0.5Ru2O7 film is formed as the variable resistance thin film 2, and Pt is formed into a film having a thickness of 0.4 μm and the Pt film is formed as the upper electrode 1. The substrate temperature when forming the Sm1.5Bi0.5Ru2O7 film is set at 400° C.

Two types of electric pulses (a positive polarity pulse and a negative polarity pulse) are alternately applied between the upper electrode 1 and the lower electrode 3, and the resistance of the variable resistance thin film 2 is measured when an electric pulse is applied once. The positive polarity pulse is an electric pulse by which the upper electrode 1 has an electrically positive polarity relative to the lower electrode 3, and the pulse has a pulse width of 100 ns and a voltage of +5V. The negative polarity pulse is an electric pulse by which the upper electrode 1 has an electrically negative polarity relative to the lower electrode 3, and the pulse has a pulse width of 100 ns and a voltage of −5V.

Figure 7:
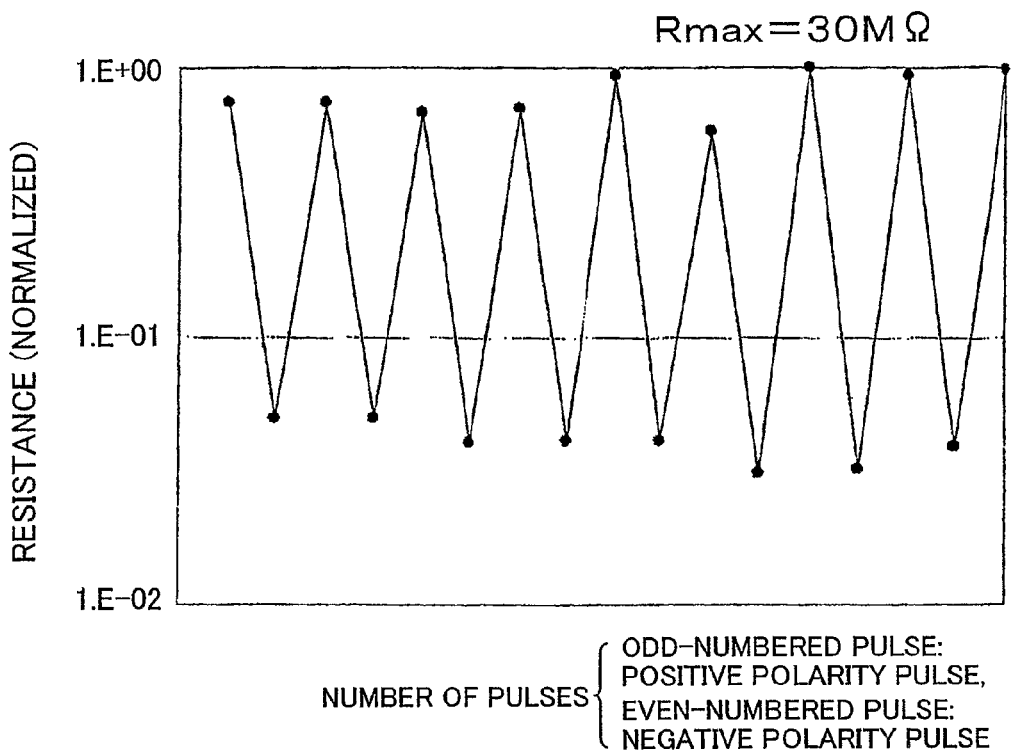
FIG. 7 depicts characteristics of Sm1.5BiO.5Ru2O7 formed into a thin film.

FIG. 7 depicts a resistance change of the variable resistance thin film 2 when the positive polarity pulse and the negative polarity pulse are alternately applied to the thin film 2 as described above. The resistance of the variable resistance thin film 2 is reduced when the positive polarity pulse is applied to the thin film 2, and increased when the negative polarity pulse is applied to the thin film 2. The resistance of the variable resistance thin film 2 normally fluctuates at the start of measurement. Therefore, FIG. 7 depicts data in a state in which the resistance of the variable resistance thin film 2 is substantially constant after repeatedly applying the electric pulse to the thin film 2. In addition, each resistance of the variable resistance thin film 2 shown in FIG. 7 is a normalized value by using a highest resistance Rmax among the resistances shown in FIG. 7. The highest resistance Rmax in this sample is 30 MΩ.

<Tl2Mn2O7>

An example of using Tl2Mn2O7 as the variable resistance thin film 2 shown in FIG. 1 will be described. Tl2Mn2O7 used herein has a magnetic transfer temperature of about 140K in a bulk state and its magnetic phase changes at this temperature.

First, Pt is formed into a film having a thickness of 0.4 μm and the Pt film is formed on the substrate 4 as the lower electrode 3, Tl2Mn2O7 is formed into a film having a thickness of about 0.1 μm and the Tl2Mn2O7 film is formed as the variable resistance thin film, and Pt is formed into a film having a thickness of 0.4 μm and the Pt film is formed as the upper electrode 1. The substrate temperature when forming the Tl2Mn2O7 film is set at 600° C.

Two types of electric pulses (a positive polarity pulse and a negative polarity pulse) are alternately applied between the upper electrode 1 and the lower electrode 3, and the resistance of the variable resistance thin film 2 is measured when an electric pulse is applied once. The positive polarity pulse is an electric pulse by which the upper electrode 1 has an electrically positive polarity relative to the lower electrode 3, and the pulse has a pulse width of 100 ns and a voltage of +5V. The negative polarity pulse is an electric pulse by which the upper electrode 1 has an electrically negative polarity relative to the lower electrode 3, and the pulse has a pulse width of 100 ns and a voltage of −5V.

Figure 8:
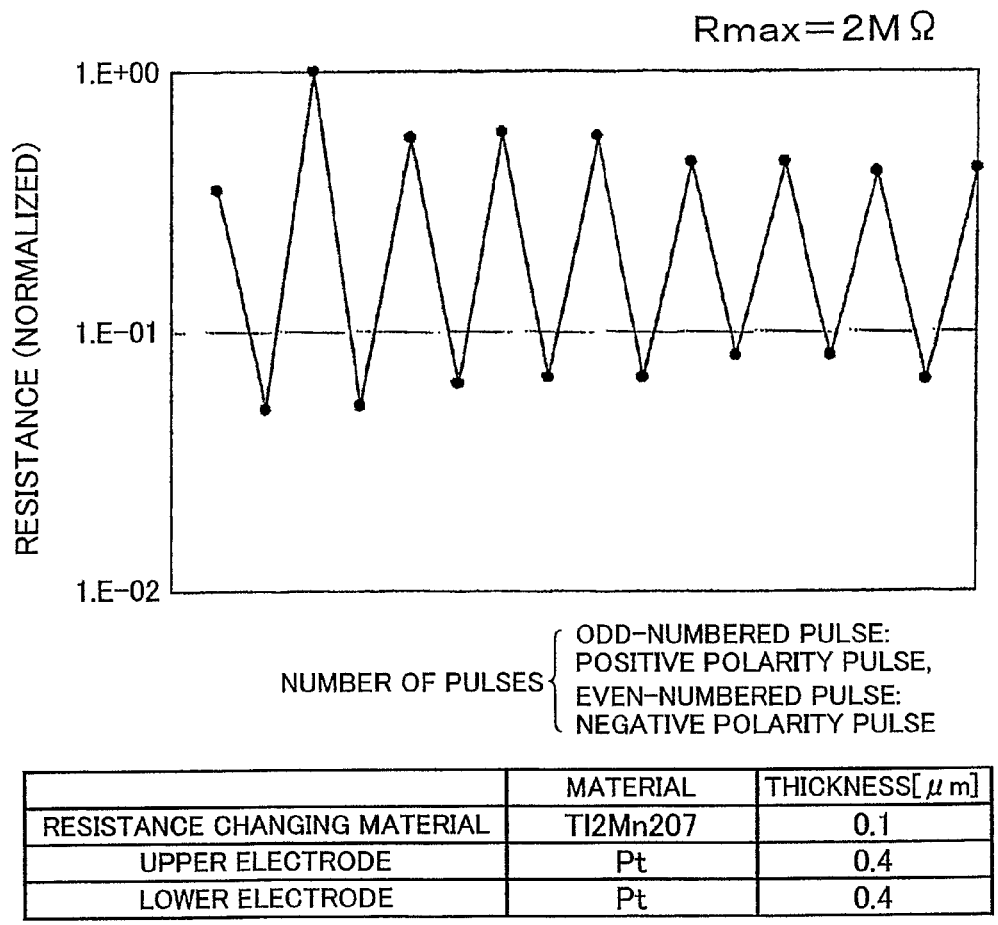
FIG. 8 depicts characteristics of Tl2Mn2O7 formed into a thin film.

FIG. 8 depicts a resistance change of the variable resistance thin film 2 when the positive polarity pulse and the negative polarity pulse are alternately applied to the thin film 2 as described above. The resistance of the variable resistance thin film 2 is reduced when the positive polarity pulse is applied to the thin film 2, and increased when the negative polarity pulse is applied to the thin film 2. The resistance of the variable resistance thin film 2 normally fluctuates at the start of measurement. Therefore, FIG. 8 depicts data in a state in which the resistance of the variable resistance thin film 2 is substantially constant after repeatedly applying the electric pulse to the thin film 2. In addition, each resistance of the variable resistance thin film 2 shown in FIG. 8 is a normalized value by using a highest resistance Rmax among the resistances shown in FIG. 8. The highest resistance Rmax in this sample is 2 MΩ.

As shown in FIGS. 7 and 8, it is discovered that, if an electric pulse is applied to the thin film formed out of the variable resistance material the resistance of which changes according to the temperature change, the resistance of the thin film changes.

As for CoFe2O4, NiCr2O4, CuFe2O4, Fe3O4, AlV2O4, Cu0.2Zn0.8Fe2O4 each having the spinel structure among the variable resistance materials, if the substrate temperature is set between 300° C. or less and a room temperature during formation of the thin film, a resistance change rate is slightly reduced in some cases but no great deterioration is observed.

<Advantage>

As described above, the variable resistance material which transfers in a bulk state according to at least one of the lattice strain, the charge-order, the temperature change, and the magnetic transfer, to a phase whose resistance is different is formed into a thin film, and the thin film can be used as the variable resistance thin film 2 of the storage device. As compared with the conventional storage device, the voltage of the electric pulse applied to the thin film 2 can be reduced.

Further, by using the variable resistance material that does not contain the alkali metal and the alkaline-earth metal as the variable resistance thin film 2, the deterioration in the characteristics of the storage device can be reduced.

By using the variable resistance material having the spinel structure as the variable resistance thin film 2, the thin film 2 can be processed at a lower temperature than the thin film having the perovskite structure.

By setting the thickness of the variable resistance thin film 2 to be equal to or less than 200 nm, the voltage of the electric pulse used to change the resistance can be further reduced.

Second Embodiment

Explanation of Circuit Symbols

Figure 9:
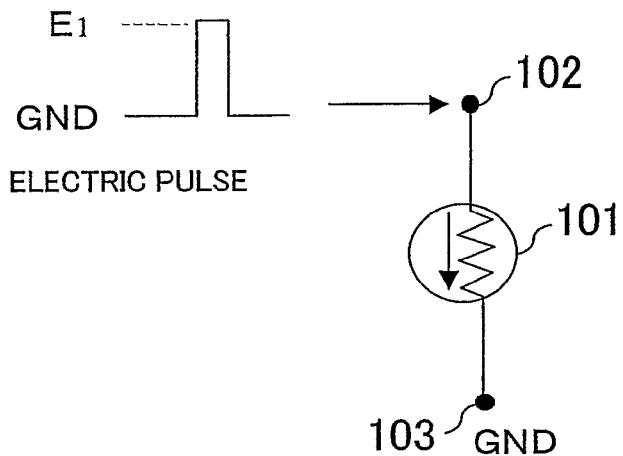
FIG. 9 depicts a memory cell used in a second embodiment of this invention.
Figure 9:
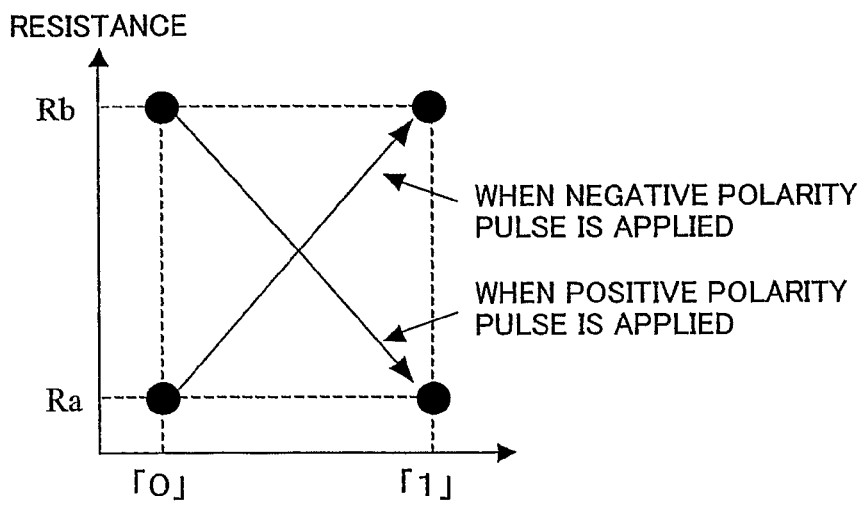

Circuit symbols of the storage device shown in FIG. 1 are defined as shown in FIG. 9(*a*). A storage device 101 is the storage device shown in FIG. 1, one of the upper electrode 1 and the lower electrode 3 shown in FIG. 1 is connected to a terminal 102, and the other electrode is connected to a terminal 103. If the electric pulse (voltage+E1), by which the terminal 102 has an electrically positive polarity relative to the terminal 103, is applied, the resistance of the storage device 101 is reduced as shown in FIG. 9(*b*). Conversely, if the electric pulse (voltage−E1), by which the terminal 102 has an electrically negative polarity relative to the terminal 103, is applied, the resistance of the storage device 101 is increased as shown in FIG. 9(*b*). Namely, if the electric pulse is applied so that a current flows in an arrow direction in the storage device 101 shown in FIG. 9(*a*), the resistance of the storage device 101 is reduced. If the electric pulse is applied so that the current flows in the direction opposite to the arrow in the storage device 101 shown in FIG. 9(*a*), the resistance of the storage device 101 is increased. As described in the first embodiment, the fluctuation of the resistance is substantially constant. Therefore, if a state in which the resistance of the storage device 101 is an initial value is assumed as "0" and the state of the resistance thereof after the electric pulse is applied is assumed as "1", the memory cell can be used as a memory cell.

Figure 10:
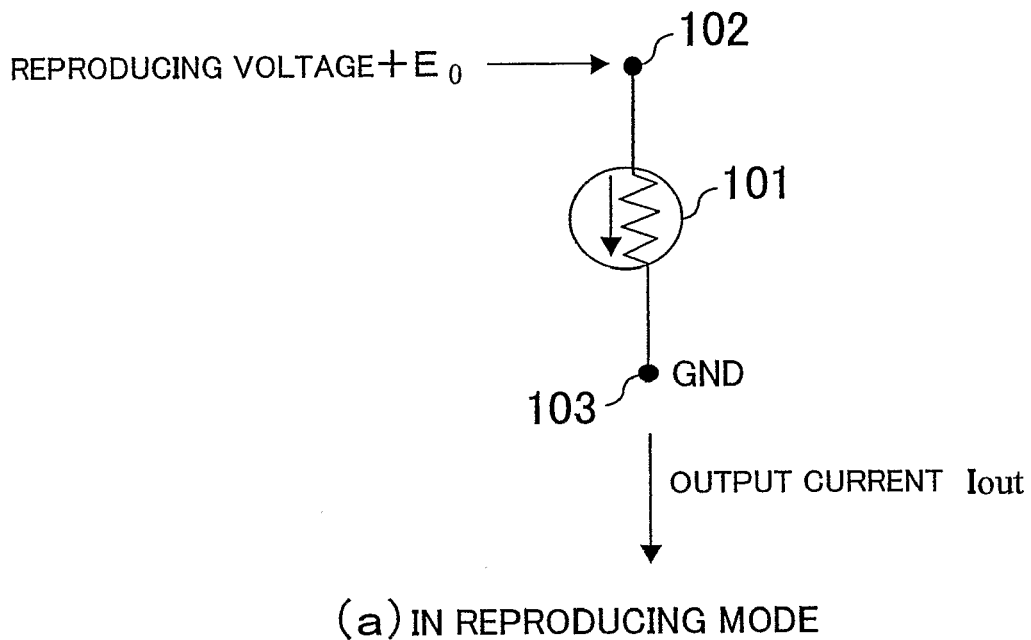
FIG. 10 depicts a memory cell used in the second embodiment of this invention.
Figure 10:
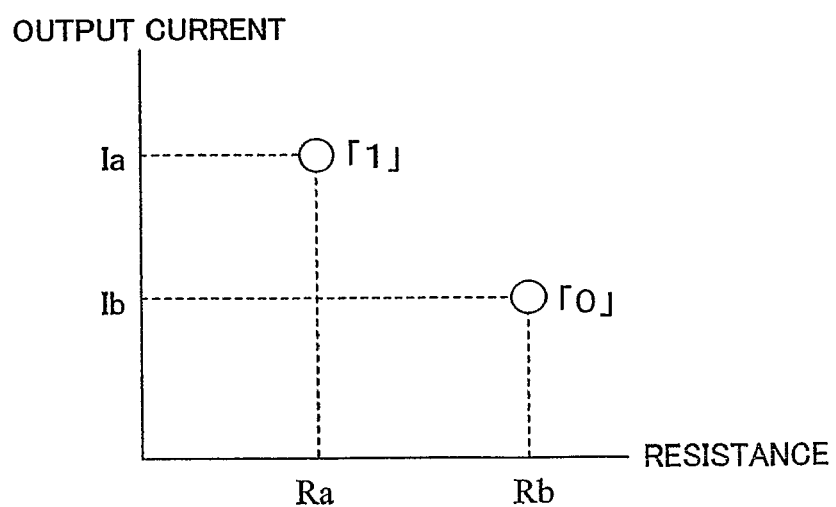

Further, if a reproducing voltage of a voltage E0 (|E0|<|E1|) lower in amplitude than the voltage of the electric pulse is applied to the terminal 102 as shown in FIG. 10(a), an output current Iout according to the resistance of the storage device 101 is output from the terminal 103. Namely, as shown in FIG. 10(b), if the resistance of the storage device 101 is a resistance Ra, the output current Iout of a current Ia is output. If the resistance of the storage device 101 is a resistance Rb (Rb>Ra), the output current Iout of a current Ib (Ib<Ia) is output. As can be seen, if the amplitude of the reproducing voltage is sufficiently lower than the amplitude of the electric pulse, the resistance of the variable resistance thin film 2 does not change. Therefore, the output current Iout according to one-bit data stored in the storage device 101 can be output. Accordingly, one-bit data (0,1) stored in the storage device 101 can be read.

<Overall Configuration>

Figure 11:
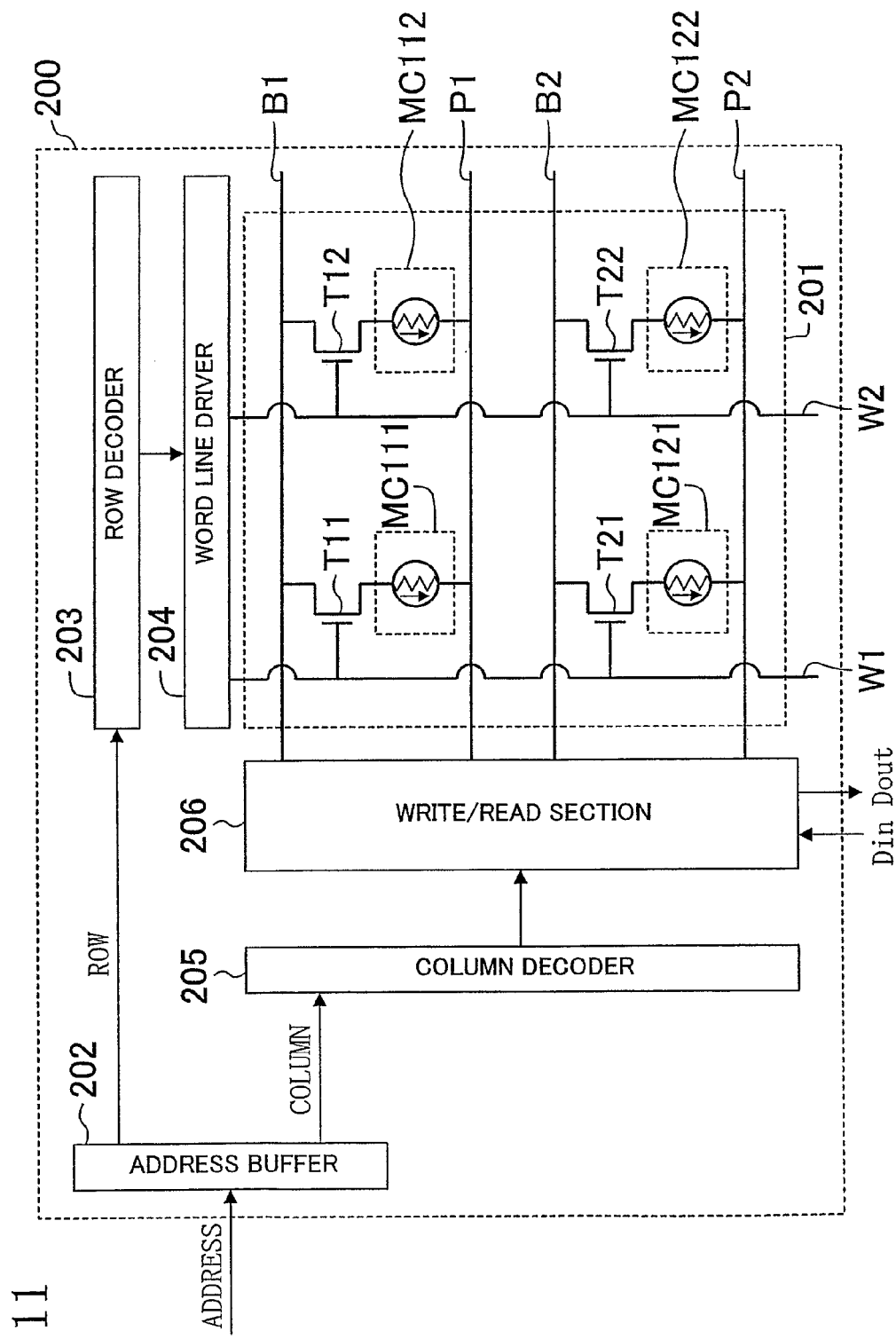
FIG. 11 depicts an exemplary configuration in block diagram form of a memory circuit according to the second embodiment of this invention.

FIG. 11 depicts overall configuration of a memory circuit 200 according to a second embodiment of this invention.

In this circuit 200, one-bit data is stored in the storage device using a resistance change of the storage device according to an applied electric pulse. This circuit includes a memory array 201, an address buffer 202, a row decoder 203, a word line driver 204, a column decoder 205, and a write/read section 206. The memory array 201 is provided with memory cells MC111, MC112, MC121, and MC122 arranged in a matrix, transistors T11, T12, T21, and T22, word lines W1 and W2, bit lines B1 and B2, and plate lines P1 and P2. Each of the memory cells MC111, MC112, MC121, and MC122 is constituted as shown in FIG. 9(a), and stores one-bit data by increasing or reducing the resistance of the storage device 101 included in the memory cell according to the applied electric pulse. Each of the transistors T11, T12, T21, and T22 turns conductive when a voltage is applied to its gate. The address buffer 202 inputs an address signal ADDRESS input from the outside, outputs a row address signal ROW to the row decoder 203, and outputs a column address signal COLUMN to the column decoder 205. The row decoder 203 selects one of the word lines W1 and W2 according to the row address signal ROW from the address buffer 202. The word line driver 204 activates the word line selected by the row decoder 203. The column decoder 205 selects one of the bit lines B1 and B2 and one of the plate lines P1 and P2 according to the column address signal COLUMN from the address buffer 202. The write/read section 206 has a storage mode and a reproducing mode. In the storage mode, the write/read section 206 applies an electric pulse according to one-bit data Din input from the outside to the bit line selected by the column decoder 205, and drops a potential of the plate line selected by the column decoder 205 to a ground potential. In the reproducing mode, the write/read section 206 applies the reproducing voltage to the bit line selected by the column decoder 205, and outputs the output current Iout from the plate line selected by the column decoder 205 as one-bit data Dout.

It is assumed herein that an address of the memory cell MC111 is "11", that of the memory cell MC112 is "12", that of the memory cell MC121 is "21", and that of the memory cell MC122 is "22". In each address, the second-figure number indicates "row address" and the first-figure number indicates "column address".

<Internal Configuration of Memory Array>

A connection relationship among respective circuit elements within the memory array 201 shown in FIG. 11 will be described.

In the memory cell MC111, a drain of the transistor T11 is connected to the terminal 102, and the plate line P1 is connected to the terminal 103. The bit line B1 is connected to a source of the transistor T11, and the word line W1 is connected to a gate of the transistor T11.

In the memory cell MC112, a drain of the transistor T12 is connected to the terminal 102, and the plate line P1 is connected to the terminal 103. The bit line B1 is connected to a source of the transistor T12, and the word line W2 is connected to a gate of the transistor T12.

In the memory cell MC121, a drain of the transistor T21 is connected to the terminal 102, and the plate line P2 is connected to the terminal 103. The bit line B2 is connected to a source of the transistor T21, and the word line W1 is connected to a gate of the transistor T21.

In the memory cell MC122, a drain of the transistor T22 is connected to the terminal 102, and the plate line P2 is connected to the terminal 103. The bit line B2 is connected to a source of the transistor T22, and the word line W2 is connected to a gate of the transistor T22.

<Operation>

Operations performed by the memory circuit 200 shown in FIG. 11 will be described. It is assumed herein that the resistance of the storage device 101 included in each of the memory cells MC111, MC112, MC121, and MC122 is initialized at the resistance Rb.

[Selection Operation]

First, the memory circuit 200 performs a selection operation of selecting a memory cell according to the address signal ADDRESS input from the outside.

Figure 12:
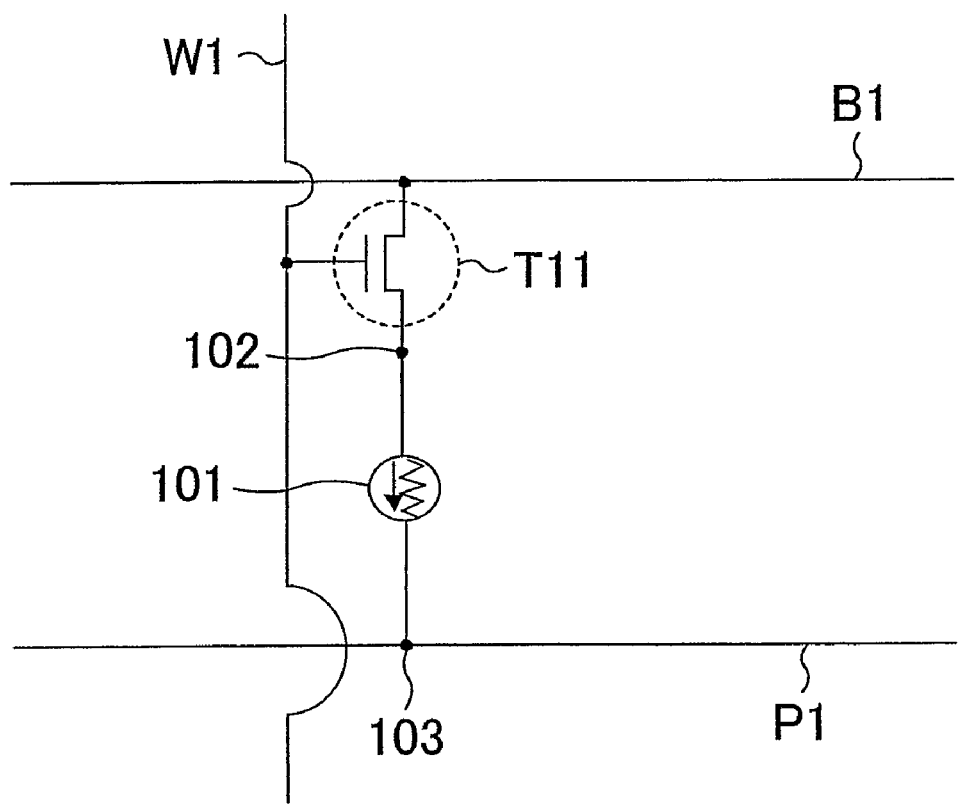
FIG. 12 depicts a partially enlarged memory array shown in FIG. 11.

It is assumed that the address signal ADDRESS which indicates the address (="11") of the memory cell MC111 is input to the address buffer 202. The address buffer 202 outputs the row address signal ROW which indicates the row address "1" to the column decoder 203, and outputs the column address signal COLUMN which indicates the column address "1" to the column decoder 205 in accordance with the input address signal ADDRESS. The selection operation will be continuously described with reference to FIG. 12.

Next, the row decoder 203 selects the word line W1 according to the row address signal ROW output from the address buffer 202.

The word line driver 204 applies a voltage to the word line W1 (activates the word line W1) selected by the row decoder 203.

Since the voltage is applied to the gates of the transistors T11 and T21 through the word line W1, both of the transistors T11 and T21 turn conductive.

On the other hand, the column decoder 205 selects the bit line B1 and the plate line P1 according to the column address signal COLUMN output from the address buffer 202.

The write/read section 206 applies a predetermined voltage to each of the bit line B1 and the plate line P1 selected by the column decoder 205 according to its operation mode.

[Storage Mode]

In the storage mode, the write/read section 206 drops the potential of the plate line P1 selected by the column decoder 205 to the ground potential.

Next, the one-bit data Din to be stored in the memory cell is input from the outside to the write/read section 206. It is assumed herein that the one-bit data Din indicates "1".

The write/read section 206 applies an electric pulse according to the one-bit data Din input from the outside to the bit line B1 selected by the column decoder 205. Since the one-bit data Din indicates "1", the electric pulse applied to the bit line B1 is assumed as a negative polarity pulse having a pulse width of 100 ns and a voltage of −4V.

The negative polarity pulse applied to the bit line B1 is applied to the storage device 101 included in the memory cell MC111 through the transistor T11. As a result, the resistance of the storage device 101 included in the memory cell MC111 changes to the resistance Ra lower than the resistance Rb (initial value).

If it is assumed that the write/read section 206 does not apply the electric pulse to the bit line B1 when the one-bit data D1 indicates "0", the resistance of the storage device 101 included in the memory cell MC11 remains the resistance Rb.

It is now assumed that the state in which the resistance of the storage device 101 is the resistance Rb (initial value) is "0", and that the state in which the resistance of the storage device 101 is the resistance Ra is "1", one-bit data Dm is stored in the memory cell MC111.

Thus, the one-bit data Din is written to the memory cell MC111, and the memory cell MC111 stores the one-bit data Dm according to the state of the resistance of the storage device 101 included in the memory cell MC111.

[Reproducing Mode]

In the reproducing mode, the write/read section 206 applies the reproducing voltage to the bit line B1 selected by the column decoder 205. It is assumed herein that the memory cell MC111 stores the one-bit data Dm which indicates "1". Namely, the resistance of the storage device 101 included in the memory cell MC111 is the resistance Ra. It is noted that the reproducing voltage is lower than the voltage of the electric pulse applied in the storage mode, e.g., +2V.

Next, the reproducing voltage applied to the bit line B1 is applied to the storage device 101 included in the memory cell MC111 through the transistor T11. In the memory cell MC111, the reproducing voltage is dropped in the storage device 101, and the output current Iout of the current Ia is output. The output current Iout output from the memory cell MC111 is applied to the plate line P1.

The write/read section 206 outputs the output current Iout output to the plate line P1 to the outside as one-bit data Dout. If the current Ia indicates "1", the write/read section 206 outputs the one-bit data Dout which indicates "1".

If the memory cell MC111 stores the one-bit data Dm which indicates "0", the resistance of the storage device 101 included in the memory cell MC111 is the resistance Rb higher than the resistance Ra. Therefore, if the write/read section 206 applies the reproducing voltage to the bit line B1, the write/read section 206 outputs the output current Iout of a current Ib (Ib<Ia) output from the memory cell MC111 as the one-bit data Dout. If the current Ib indicates "0", the write/read section 206 outputs the one-bit data Dout which indicates "0".

In this way, the output current Iout of the current according to the one-bit data Dm stored in the memory cell is output.

<Problems During Formation>

In the semiconductor manufacturing process of forming such a nonvolatile storage device, a cleaning step is executed after forming the thin film made of the variable resistance material on an Si wafer. At this cleaning step, characteristics of the device are often deteriorated because of the elusion of a specific element from the thin film made of the variable resistance material. Such elements are, for example, the alkaline-earth metal and the alkali metal. If the conventional Pr1-xCaMnO3(PCMO), which is the perovskite CMR material, is used, the device characteristics are deteriorated by elusion of Ca. In contrast, since NiCr2O4 used in this embodiment does not contain either the alkali metal or the alkaline-earth metal, the deterioration in the device characteristics is extremely small.

<Material Suited for Electrodes>

As the material for the upper electrode 1 and the lower electrode 3 included in the storage device 101, Ag, Au, or Ir can be used in place of Pt, Ru(O2), or IrO2 mentioned above. Normally, however, it is necessary to use, as the material for the lower electrode, a material that is stable at a heating temperature since the variable resistance thin film 2 is normally formed by heating the substrate 4. Therefore, although Ag is low in work function and suitable as the electrode material, it can be used only as the material for the upper electrode 1.

In case of the storage device using, as the variable resistance thin film 2, NiCr2O4 having a thickness of 0.1 μm, if Pt is used for the upper electrode 1 and the lower electrode 3, the electric pulse at a voltage of ±3V needs to be applied to the variable resistance thin film 2 so as to change the resistance of the thin film 2. However, if not Pt but Au is used for the upper electrode 1 and the lower electrode 3, the resistance of the variable resistance thin film 2 changes by applying the electric pulse at a voltage of ±2.5V to the thin film 2. If Ir is used for the lower electrode 3 and Ag is used for the upper electrode 1, the resistance of the variable resistance thin film 2 changes by applying the electric pulse at a voltage of ±2V to the thin film 2. This indicates that by using the material having a low work function as the electrode material, the voltage of the applied electric pulse can be reduced.

<Advantage>

As described above, information can be stored using the resistance change of the storage device. This storage circuit is fast in an information writing rate and can store lots of information, as compared with a conventional memory such as a flash memory or a ferroelectric memory.

FIG. 11 depicts that only four memory cells are present. However, the number of memory cells is not limited to four but five or more memory cells can be arranged in a matrix.

According to this embodiment, the memory cell is allowed to operate by holding one-bit data as two states of a high-resistance state and a low-resistance state. Alternatively, the memory cell can operate as a nonvolatile storage device that stores four or more resistance states as two-bit information or three or more-bit information by changing the width and amplitude of the electric pulse.

Third Embodiment

Configuration of Memory Cell

Figure 13:
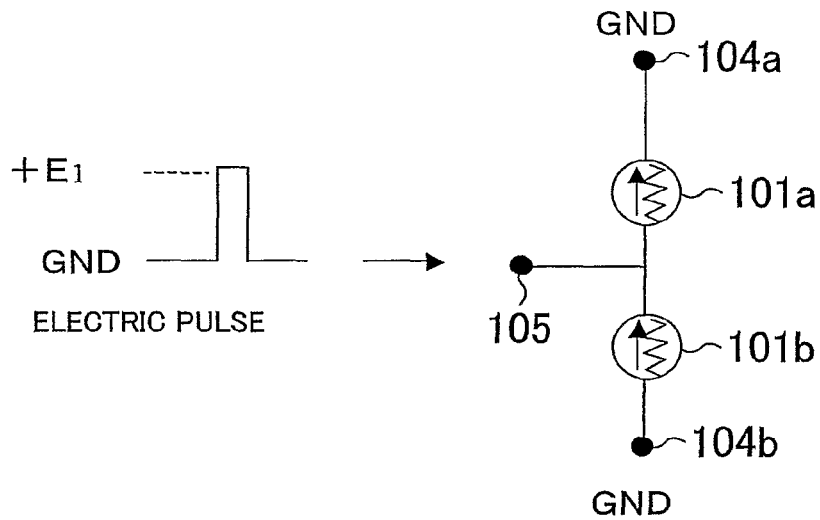
FIG. 13(a) depicts an electric pulse and configuration of a memory cell used in a third embodiment of this invention in recording mode.
FIG. 13(b) depicts resistance changes of storage devices in a third embodiment of this invention in recording mode.
Figure 13:
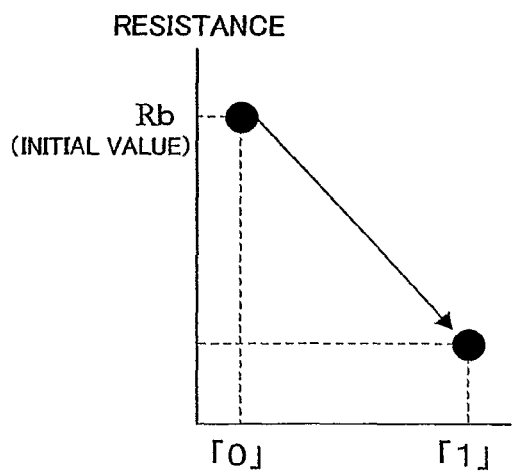
Figure 13:
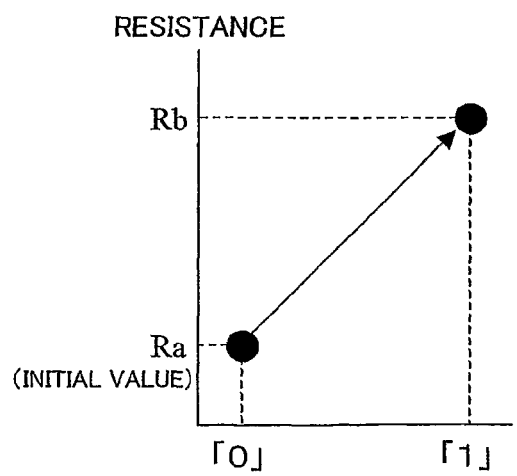

FIG. 13(a) depicts configuration of a memory cell used in a memory circuit according to a third embodiment of this invention. This memory cell includes two storage devices 101a and 101b between terminals 104a and 104b. The storage device 101a is equal in configuration to the storage device 101, and provided between terminals 104a and 105. The storage device 101b is equal in configuration to the storage device 101, and provided between terminals 105 and 104b. A resistance of each of the storage devices 101a and 101b is initialized. The resistance of the storage device 101a is the resistance Rb, and the resistance of the storage device 101b is the resistance Ra (Ra<Rb). As shown in FIG. 13(a), if potentials of the terminals 104a and 104b are dropped to the ground potential and an electric pulse (a positive polarity pulse at a voltage of +E1) is applied to the terminal 105, then, as shown in FIG. 13(b), the resistance of the storage device 101a is reduced from the resistance Rb to the resistance Ra, and the resistance of the storage device 101b is increased from the resistance Ra to the resistance Rb. The fluctuation in the resistance of the storage device 101b is substantially constant as described in the first embodiment. Therefore, if a state in which the resistance of the storage device 101 is an initial value (the resistance Rb) is assumed as "0" and the state of the resistance thereof after the electric pulse is applied is assumed as "1", the memory cell can be used as a memory cell.

Figure 14:
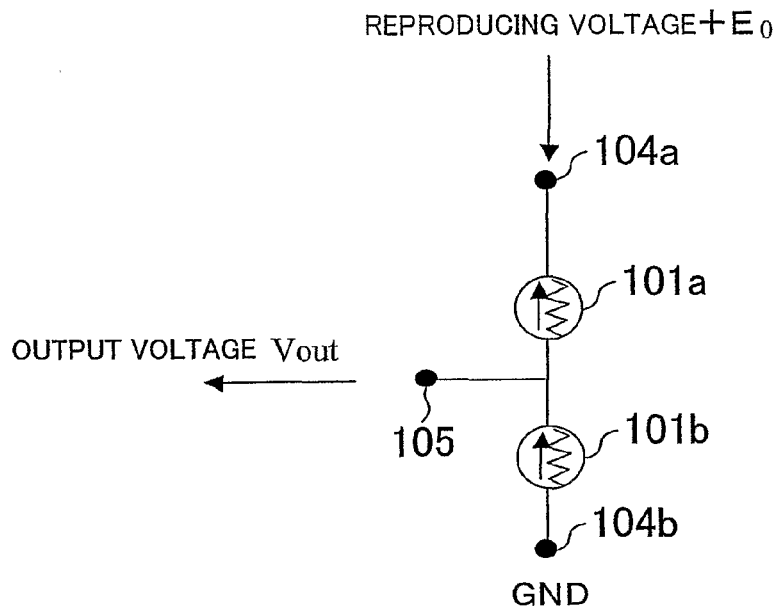
FIG. 14(a) depicts a reproducing voltage and configuration of a memory cell used in a third embodiment of this invention in reproducing mode.
FIG. 14(b) depicts an output voltage of a storage device in a third embodiment of this invention in reproducing mode.
Figure 14:
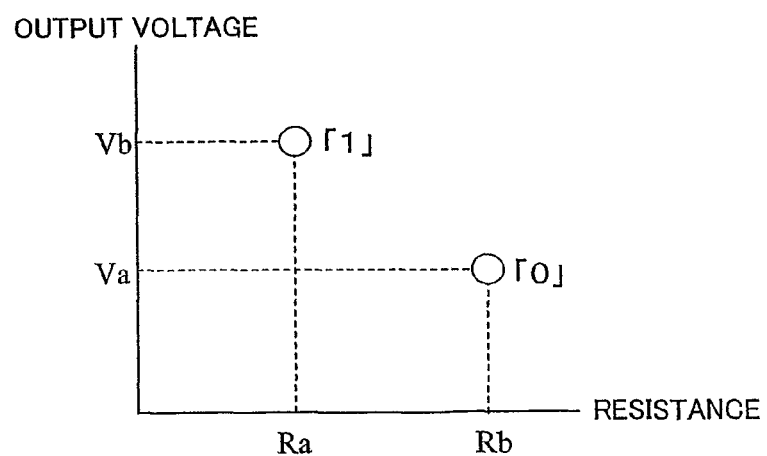

Further, as shown in FIG. 14(a), if the potential of the terminal 104b is dropped to the ground potential, and a reproducing voltage of a voltage E0 ($|E0|<|E1|$) lower in amplitude than the voltage of the electric pulse is applied to the terminal 104a, an output voltage Vout according to a ratio of the resistance of the storage device 101a to that of the storage device 101b is output from the terminal 105. Namely, as shown in FIG. 14(b), if the resistance of the storage device 101a is the resistance Ra, the output voltage Vout of a voltage Va is output. If the resistance of the storage device 101a is the resistance Rb (Rb>Ra), the output voltage Vout of a voltage Vb (Vb<Va) is output. As can be seen, if the amplitude of the reproducing voltage is sufficiently lower than that of the electric pulse, the resistance of the variable resistance thin film 2 does not change. Therefore, the output voltage Vout according to one-bit data stored in the memory cell can be output. Accordingly, one-bit data (0,1) stored in the memory cell can be read.

<Configuration>

Figure 15:
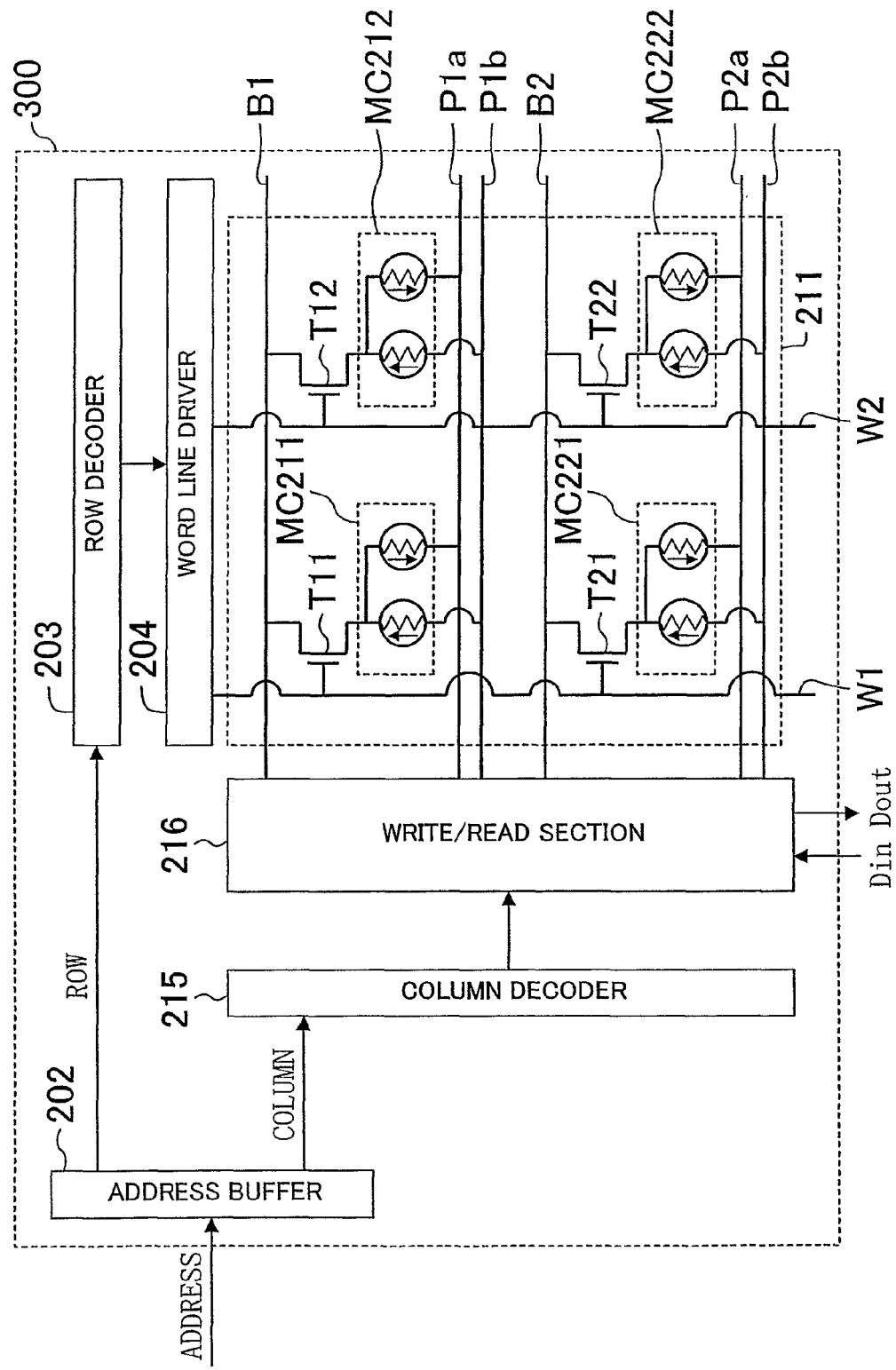
FIG. 15 depicts an exemplary block diagram configuration of a memory circuit according to the third embodiment of this invention.

FIG. 15 depicts configuration of a memory circuit 300 according to the third embodiment of this invention. The memory circuit 300 includes a column decoder 215, a memory array 211, and a write/read section 216 instead of the memory array 201, the column decoder 205, and the write/read section 206 shown in FIG. 11. The other constituent elements of the memory circuit 300 are equal to those shown in FIG. 11.

<Internal Configuration of Memory Array>

The memory array 211 shown in FIG. 15 includes memory cells MC211, MC212, MC221, and MC222, first plate lines P1a and P2a, and second plate lines P1b and P2b in place of the memory cells MC211, MC212, MC221, and MC222 and the plate lines P1 and P2. The other constituent elements of the memory array 211 are equal to those shown in FIG. 11. Each of the memory cells MC211, MC212, MC221, and MC222 is constituted as shown in FIG. 13(a), and stores one-bit data by increasing or reducing the resistances of the storage devices 101a and 101b included in the memory cell according to an applied electric pulse.

In the memory cell MC211, the terminal 105 is connected the drain of the transistor T11, the terminal 104a is connected to the first plate line P1a, and the terminal 104b is connected to the second plate line P1b. The source of the transistor T11 is connected to the bit line B1, and the gate thereof is connected to the word line W1.

In the memory cell MC212, the terminal 105 is connected the drain of the transistor T12, the terminal 104a is connected to the first plate line P1a, and the terminal 104b is connected to the second plate line P1b. The source of the transistor T12 is connected to the bit line B1, and the gate thereof is connected to the word line W2.

In the memory cell MC221, the terminal 105 is connected the drain of the transistor T21, the terminal 104a is connected to the first plate line P2a, and the terminal 104b is connected to the second plate line P2b. The source of the transistor T11 is connected to the bit line B2, and the gate thereof is connected to the word line W1.

In the memory cell MC222, the terminal 105 is connected the drain of the transistor T22, the terminal 104a is connected to the first plate line P2a, and the terminal 104b is connected to the second plate line P2b. The source of the transistor T11 is connected to the bit line B2, and the gate thereof is connected to the word line W2.

It is assumed that an address of the memory cell MC211 is "11", an address of the memory cell MC212 is "12", an address of the memory cell MC221 is "21", and an address of the memory cell MC222 is "22". In each address, the second-figure number indicates "row address" and the first-figure number indicates "column address".

<Column Decoder and Write/Read Section>

The column decoder 215 selects one of the bit lines B1 and B2, one of the first plate lines P1a and P2a, and one of the second plate lines P1b and P2b according to the column address signal output from the address buffer 202.

The write/read section 216 has a storage mode and a reproducing mode. In the storage mode, the write/read section 216 applies an electric pulse according to one-bit data Din from the outside to the bit line selected by the column decoder 215, and drops the potentials of the first plate line and the second plate line selected by the column decoder 215 to the ground potential. In the reproducing mode, the write/read section 216 drops the potential of the first plate line selected by the column decoder 215 to the ground potential, applies a reproducing voltage to the second plate line selected by the column decoder, and outputs the output voltage from the bit line selected by the column decoder 215 to the outside as one-bit data Dout.

<Operation>

Operations performed by the memory circuit 300 shown in FIG. 15 will be described. It is assumed herein that the resistance of the storage device 101a is initialized at the resistance Rb, and that the resistance of the storage device 101b is initialized at the resistance Ra (Ra<Rb) in each of the memory cells MC211, MC212a, MC221, and MC222.

[Selection Operation]

Figure 16:
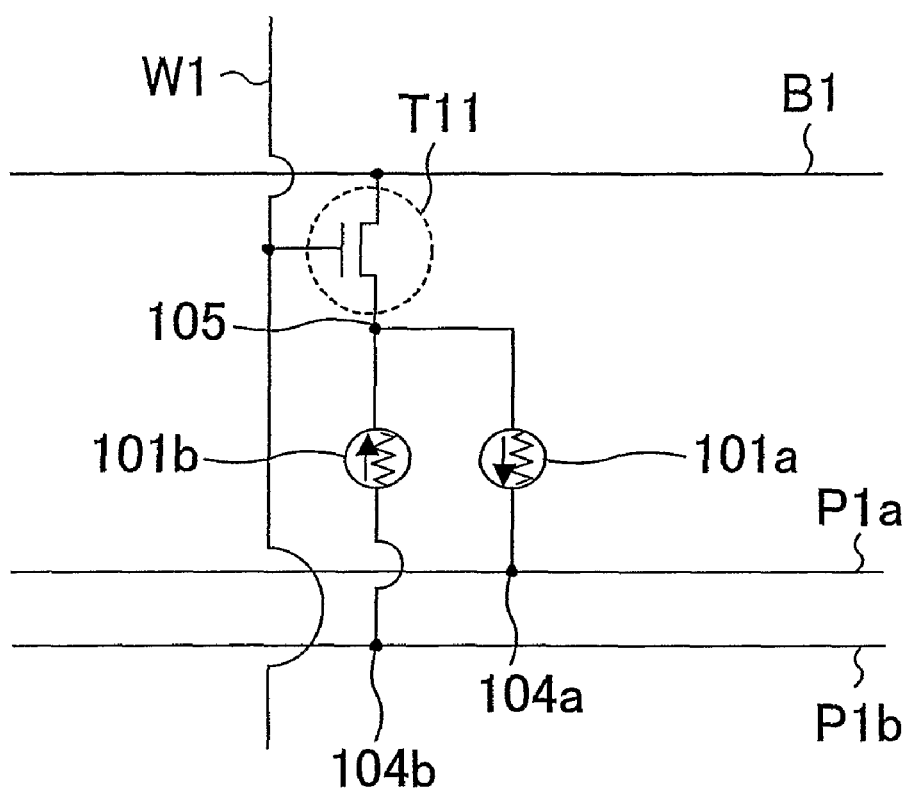
FIG. 16 depicts a partially enlarged memory array shown in FIG. 15.

Similarly to the memory circuit 200, the memory circuit 300 performs a selection operation. It is assumed herein that the memory cell MC211 is selected. Namely, the column decoder 215 selects the bit line B1, the first plate line P1a, and the second plate line P1b, and the row decoder 203 selects the word line W1. The selection operation will be continuously described with reference to FIG. 16.

[Storage Mode]

In the storage mode, the write/read section 216 drops the potentials of the first plate line P1a and the second plate line P1b selected by the column decoder 215 to the ground potential.

Next, the one-bit data Din to be stored in the memory cell is input from the outside to the write/read section 216. It is assumed herein that the one-bit data Din indicates "1".

The write/read section 216 applies an electric pulse according to the one-bit data Din input from the outside to the bit line B1 selected by the column decoder 215. Since the one-bit data Din indicates "1", the electric pulse applied to the bit line B1 is assumed as a negative polarity pulse having a pulse width of 100 ns and a voltage of −4V.

The negative polarity pulse applied to the bit line B1 is applied to the terminal 105 included in the memory cell MC211 through the transistor T11. As a result, the resistance of the storage device 101a included in the memory cell MC211 changes to the resistance Ra lower than the resistance Rb (initial value), and the resistance of the storage device 101b included in the memory cell MC211 changes to the resistance Rb higher than the resistance Ra (initial value).

If it is assumed that the write/read section 216 does not apply the electric pulse to the bit line B1 when the one-bit data D1 indicates "0", the resistances of the storage devices 101a and 101b included in the memory cell MC211 remain the resistances Rb and Ra, respectively.

It is now assumed that the state in which the resistance of the storage device 101a is the resistance Rb (initial value) is "0", and that the state in which the resistance of the storage device 101a is the resistance Ra is"1", one-bit data Dm is stored in the memory cell MC211.

Thus, the one-bit data Din is written to the memory cell MC211, and the memory cell MC211 stores the one-bit data Dm according to the state of the resistances of the storage devices 101a and 101b included in the memory cell MC211.

[Reproducing Mode]

In the reproducing mode, the write/read section 216 drops the potential of the plate line P1b selected by the column decoder 215 to the ground potential, and applies the reproducing voltage to the first plate line P1a. It is assumed herein that the memory cell MC211 stores the one-bit data which indicates "1". Namely, it is assumed that the resistance of the storage device 101a included in the memory cell MC211 is the resistance Ra, and that the resistance of the storage device 101b is the resistance Rb. It is noted that the reproducing voltage is lower than the voltage of the electric pulse applied in the storage mode, e.g., +2V.

Next, the reproducing voltage applied to the first plate line P1a is applied to the terminal 105 included in the memory cell MC211 through the transistor T11. In the memory cell MC211, the reproducing voltage is the output voltage Vout of the voltage Va according to the ratio of the resistance of the storage device 101a to that of the storage device 101b. The output voltage Vout output from the memory cell MC211 is applied to the bit line B1.

The write/read section 216 outputs the output voltage Vout output to the bit line B1 to the outside as the one-bit data Dout. If the voltage Va indicates "1", the write/read section 216 outputs the one-bit data Dout which indicates "1".

If the memory cell MC211 stores the one-bit data Dm which indicates "0", then the resistance of the storage device 101a included in the memory cell MC211 is the resistance Rb higher than the resistance Ra, and the resistance of the storage device 101b included in the memory cell MC211 is the resistance Ra lower than the resistance Rb. Therefore, if the write/read section 216 applies the reproducing voltage to the first plate line P1a, the write/read section 216 outputs the output voltage Vout of the voltage Vb (Vb<Va) output from the memory cell MC211 as the one-bit data Dout. If the voltage Va indicates "0", the write/read section 216 outputs the one-bit data Dout which indicates "0".

In this way, since the reproducing voltage is dropped according to the resistance of the storage device 101, the output voltage Vout of the voltage according to the one-bit data Dm stored in the memory cell is output.

<Advantage of Complementary Resistance Changes>

Normally, characteristics of the storage devices fluctuate among different memory arrays and among the storage devices present in the same memory array. This fluctuation often makes the resistance changes of the respective storage devices non-uniform. That is, an upper limit of the resistance of a certain storage device is often higher than a desired resistance, or a lower limit of the resistance of the certain storage device is often lower than the desired resistance.

With the circuit configuration according to this embodiment, however, the resistances of the storage devices 101a and 101b change complementarily with each other. Therefore, the output voltage Vout according to the ratio of the resistance of the storage device 101a to that of the storage device 101b is substantially equal. As a result, even if the resistances of the storage devices differ according to locations, a different recording state can be reproduced with a resolution.

<Advantage>

By constituting the memory cell so that the two storage devices 101a and 101b are connected in series to allow the resistances of the two storage devices to change complementarily, it is possible to ensure stable operations as the memory device and greatly improve manufacturing yield.

Further, the lower the amplitude of the electric pulse applied to the storage devices 101a and 101b is, the lower the resistance change rates of the storage devices 101a and 101b become. However, the output voltage Vout is substantially constant. As compared with the second embodiment, therefore, the voltage of the electric pulse applied during data writing can be reduced.

FIG. 15 depicts that only four memory cells are present. However, the number of memory cells is not limited to four but five or more memory cells can be arranged in a matrix.

According to this embodiment, the memory cell is allowed to operate by holding one-bit data as two states of a high-resistance state and a low-resistance state. Alternatively, the memory cell can operate as a nonvolatile storage device that stores four or more resistance states as two-bit information or three or more-bit information by changing the width and amplitude of the electric pulse.

Fourth Embodiment

Configuration

Figure 17:
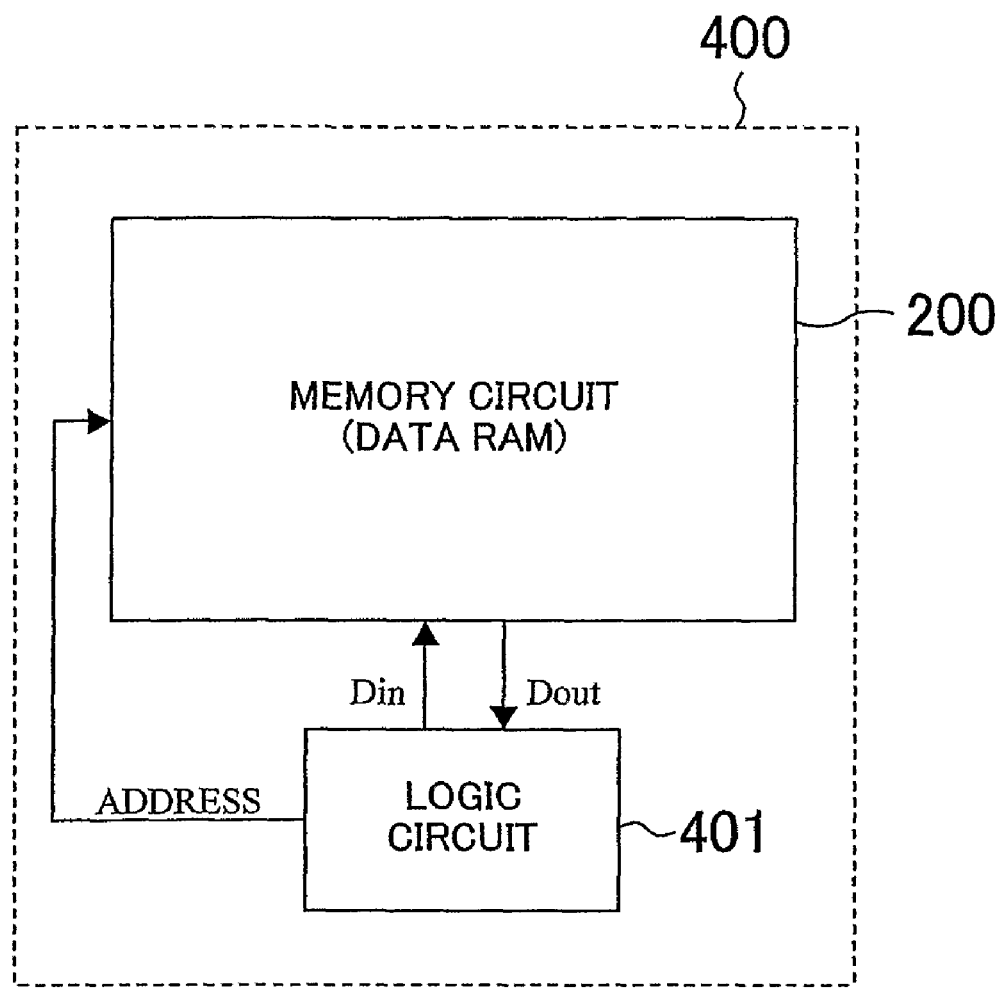
FIG. 17 depicts an exemplary block diagram configuration of Embedded-RAM according to the fourth embodiment of this invention.

FIG. 17 depicts configuration of a semiconductor integrated circuit (Embedded-RAM) 400 according to a fourth embodiment of this invention. This circuit 400 employs the memory circuit 200 shown in FIG. 11 as a data RAM, and includes the memory circuit 200 and a logic circuit 401. The logic circuit 401 outputs the address signal ADDRESS that indicates an address of a desired memory to the address buffer 202 included in the memory circuit 200, thereby selecting a memory cell to or from which data is written or read. In addition, the logic circuit 401 controls the operation mode of the write/read circuit 206, thereby writing the one-bit data Din to the selected memory cell or reading the one-bit data Dm written to the selected memory cell.

<Operation>

Operations performed by the semiconductor integrated circuit (Embedded-RAM) 400 shown in FIG. 17 will be described.

If the one-bit data Din is to be written to the memory circuit 200, the logic circuit 401 sets the operation mode of the write/read section 206 included in the memory circuit 200 at the storage mode.

The logic circuit 401 outputs the address signal ADDRESS which indicates the address of the memory cell, in which the one-bit data Din is to be stored, to the address buffer 202 included in the memory circuit 200.

The logic circuit 401 outputs the one-bit data Din to be written to the write/read section 206 included in the memory circuit 200.

The memory circuit 200 then performs the same operations as those described in the second embodiment, and the one-bit data Din output from the logic circuit 401 is written to the memory cell included in the memory circuit 200.

If the one-bit data Dm written to the memory cell included in the memory circuit 200 is to be read, the logic circuit 401 sets the operation mode of the write/read circuit 206 included in the memory circuit 200 at the reproducing mode.

The logic circuit 401 outputs the address signal ADDRESS which indicates the address of the memory cell from which the one-bit data is to be read, to the address buffer 202 included in the memory circuit 200.

The memory circuit 200 then performs the same operations as those described in the second embodiment, the output circuit Iout according to the one-bit data Dm stored in the selected memory cell is input to the write/read section 206, and the write/read section 206 outputs the output current Iout to the logic circuit 401 as the one-bit data Dout.

<Advantage>

As described above, large amounts of information can be stored in the storage device at high rate.

It is noted that the same advantage can be attained even if the memory circuit 300 shown in FIG. 15 is employed in place of the memory circuit 200.

Fifth Embodiment

Configuration

Figure 18:
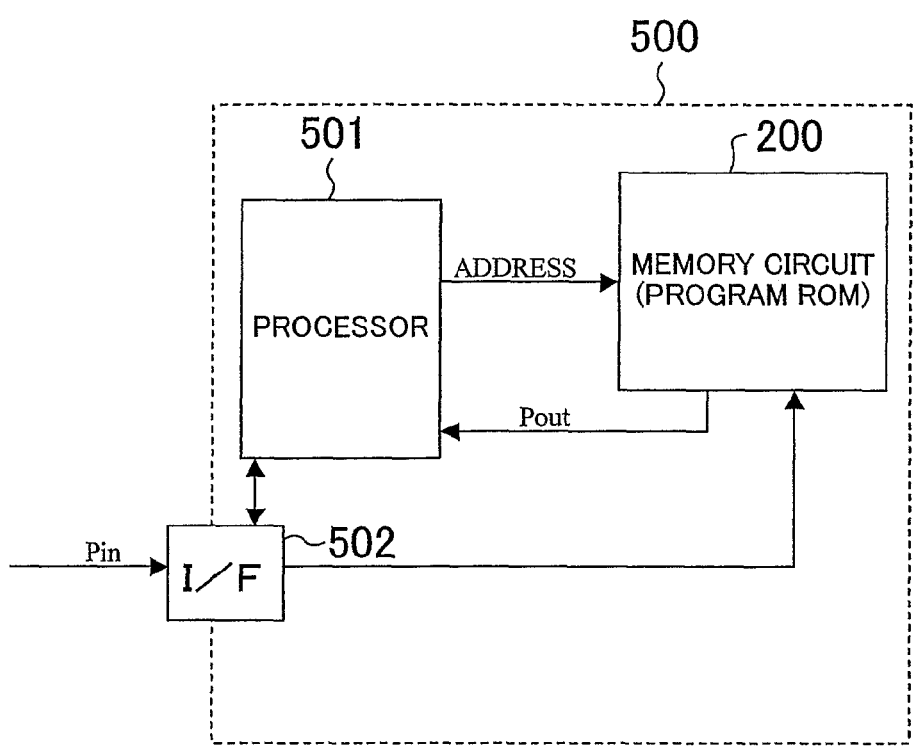
FIG. 18 depicts an exemplary block diagram configuration of a system LSI according to a fifth embodiment of this invention.

FIG. 18 depicts configuration of a semiconductor integrated circuit (reconfigurable LSI) 500 according to a fifth embodiment of this invention. This circuit 500 employs the memory circuit 200 shown in FIG. 11 as a program ROM, and includes the memory circuit 200, a processor 501, and an interface 502. The memory circuit 200 stores a program necessary for an operation of the processor 501. The processor 501 controls the memory circuit 200 and the interface 502, reads the program Pm stored in the memory circuit 200, and performs a processing according to this program Pm. The interface 502 outputs a program Pin input from the outside to the storage circuit 200.

<Operation>

Operations performed by the semiconductor integrated circuit (reconfigurable LSI) 500 shown in FIG. 18 will be described.

If the program Pin is to be written to the memory circuit 200 from the outside, then the processor 501 sets the operation mode of the write/read section 206 included in the memory circuit 200 at the storage mode, and outputs the address signal ADDRESS which indicates an address of a memory cell to which the program Pin is to be written, to the address buffer 202 included in the memory circuit 200.

The interface 502 inputs the program Pin input from the outside, and outputs the input program Pin to the write/read section 206 included in the memory circuit 200.

The memory circuit 200 then performs the same operations as those described in the second embodiment, and the program Pin from the interface 502 is written to the memory cell.

If the program Pm written to the memory circuit 200 is to be read, then the processor 501 sets the operation mode of the write/read section 206 included in the memory circuit 200 at the reproducing mode, and outputs the address signal ADDRESS which indicates an address of a memory cell from which the program Pm is to be read, to the address buffer 202 included in the memory circuit 200.

The memory circuit 200 then performs the same operations as those described in the second embodiment, and the output current Iout according to the program Pm stored in the selected memory cell is input to the write/read section 206. The write/read section 206 outputs the input output current Iout to the processor 501 as a program Pout.

The processor 501 performs operations based on the input program Pout.

Since the memory circuit 200 is a programmable nonvolatile memory, a content of the program to be stored can be rewritten. It is thereby possible to change a function realized by the processor 501. In addition, by storing a plurality of programs in the memory circuit 200, the function realized by the processor 501 can be changed according to a read program.

<Advantage>

As described above, it is possible to realize different functions using one LSI (that is, provide a so-called reconfigurable LSI).

It is noted that the same advantage can be attained even if the memory circuit 300 shown in FIG. 15 is employed in place of the memory circuit 200.

INDUSTRIAL APPLICABILITY

The storage device according to the present invention is effective as a nonvolatile memory or the like which can write information at high rate and which can store lots of information.

The invention claimed is:

1. A thin film storage device, comprising:
a first electrode formed over a surface of a substrate;
a variable resistance thin film formed by a material whose resistance changes in accordance with a voltage pulse and having a spinel structure formed over a surface of the first electrode;
a second electrode formed over a surface of the variable resistance thin film; and
an electric circuit configured to apply a voltage pulse to the first and second electrodes,
wherein a resistance in a bulk state of the material which constitutes the variable resistance thin film changes in accordance with a lattice strain generated by a Jahn-Teller effect,
a thickness of the variable resistance thin film is equal to or less than 200 nm, and
said first electrode directly contacts a first surface of said variable resistance thin film, and said second electrode directly contacts a second surface of said variable resistance thin film.

2. The thin film storage device of claim 1, wherein the material does not contain an alkali metal or an alkaline-earth metal.

3. The thin film storage device of claim 1, wherein the variable resistance thin film is constituted by a single phase.

4. The thin film storage device of claim 1, wherein the variable resistance thin film comprises a plurality of resistance phases.

5. The thin film storage device of claim 1, wherein the variable resistance thin film is a single layer film.

* * * * *